United States Patent [19]
Tanimura et al.

[11] Patent Number: 5,880,998
[45] Date of Patent: Mar. 9, 1999

[54] SYNCHRONOUS SEMICONDUCTOR MEMORY DEVICE IN WHICH CURRENT CONSUMED BY INPUT BUFFER CIRCUIT IS REDUCED

[75] Inventors: Masaaki Tanimura; Yasuhiro Konishi, both of Hyogo, Japan

[73] Assignee: Mitsubishi Denki Kabushiki Kaisha, Tokyo, Japan

[21] Appl. No.: 960,268

[22] Filed: Oct. 29, 1997

Related U.S. Application Data

[63] Continuation of Ser. No. 840,154, Apr. 11, 1997, abandoned, which is a continuation of Ser. No. 648,606, May 15, 1996, abandoned.

[30] Foreign Application Priority Data

Jan. 17, 1996 [JP] Japan ................................. 8-005781

[51] Int. Cl.$^6$ ................................................ G11C 7/00
[52] U.S. Cl. ................ 365/189.05; 365/233; 365/230.08
[58] Field of Search .............................. 365/189.05, 233, 365/230.08, 194

[56] References Cited

U.S. PATENT DOCUMENTS 5,229,966  7/1993  Ohsawa et al. .
5,469,386  11/1995  Obara .
5,559,752  9/1996  Stephens, Jr. et al. ................. 365/233

FOREIGN PATENT DOCUMENTS 6-290583  10/1994  Japan .

OTHER PUBLICATIONS

"A 100MHz Dual–Bank 16Mbit Synchronous DRAM", Yasuhiro Konishi et al, Mitsubishi Denki Giho: vol. 69, No. 3, pp. 51–53 Mar. (1995).

Primary Examiner—Huan Hoang
Attorney, Agent, or Firm—McDermott, Will & Emery

[57] ABSTRACT

An external clock enable signal is taken in accordance with a first internal clock signal from clock buffer circuit from which an input buffer enable signal is generated to be input to input buffer circuit. Current path in the input buffer circuit is shut off in accordance with the input buffer enable signal. Since the state of the input buffer enable signal is changed in synchronization with the rise of the internal clock signal, the set up time of the external signal can be sufficiently ensured while current consumption of input buffer circuit can be reduced.

16 Claims, 12 Drawing Sheets

FIG. 13 PRIOR ART
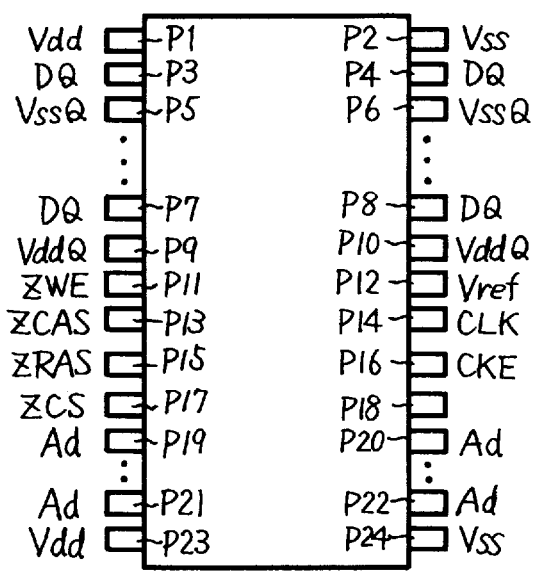
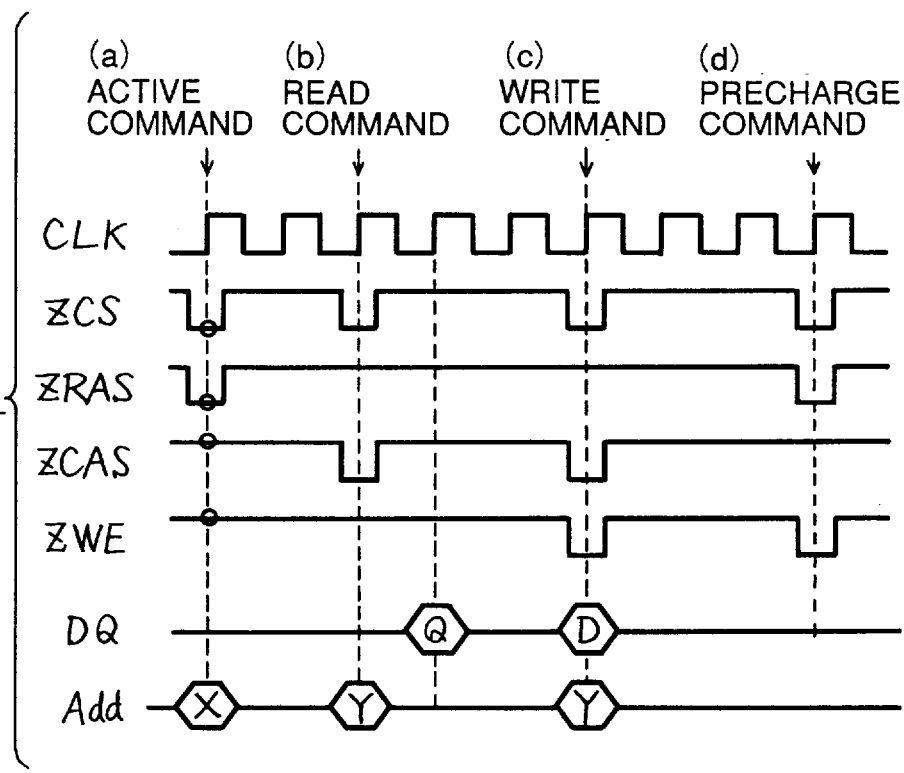
FIG. 14 PRIOR ART

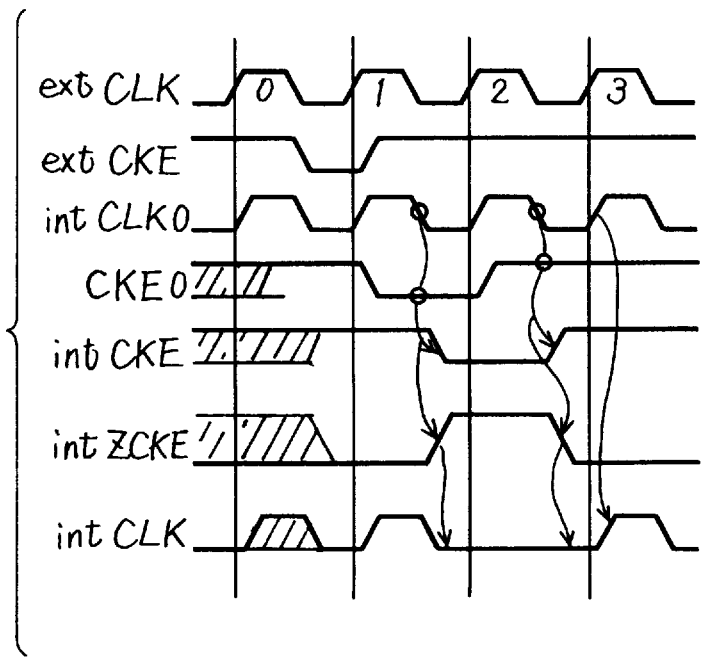
FIG. 18 PRIOR ART
FIG. 19 PRIOR ART
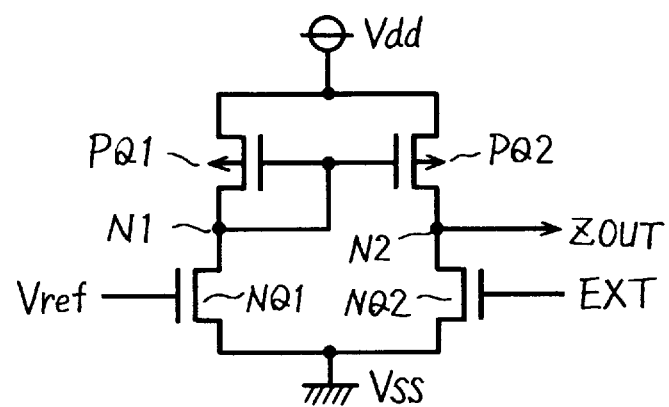

SYNCHRONOUS SEMICONDUCTOR MEMORY DEVICE IN WHICH CURRENT CONSUMED BY INPUT BUFFER CIRCUIT IS REDUCED

This application is a continuation of application Ser. No. 08/840,154 filed Apr. 11, 1997, now abandoned, which is a continuation of application Ser. No. 08/648,606 filed May 15, 1996, now abandoned.

BACKGROUND OF THE INVENTION

1. Field of the Invention

The present invention relates to a clock synchronous type semiconductor memory device which operates in synchronization with an externally applied clock signal. More specifically, the present invention relates to a structure of an input buffer receiving an external signal in the clock synchronous type semiconductor memory device.

2. Description of the Background Art

Various memory LSIs (Large Scale Integrated Circuits) allowing high speed access have been proposed to eliminate difference in speed of operation between a microprocessor and a memory. These memory LSIs are characterized in that effective data transfer rate is increased by inputting/outputting data in synchronization with an external clock signal. One of such synchronous memories operating in synchronization with an external clock signal is a synchronous DRAM (hereinafter referred to as an SDRAM). The SDRAM includes a memory cell generally constituted by a dynamic type memory cell of one capacitor/one transistor.

FIG. 13 shows an example of an arrangement of external pin terminals in a conventional SDRAM. Referring to FIG. 13, external pin terminals are arranged on both sides along longer side direction of a rectangular package (TSOP: Thin Small Outline Package). On opposing ends in the longer side direction of the package, there are arranged pin terminals P1 and P23 receiving a power supply voltage Vdd, and pin terminals P2 and P24 receiving the ground voltage Vss. Adjacent to power supply pin terminal P1 and ground pin terminal P2, pin terminals P3, P4 . . . P7, and P8 for data input/output are arranged. Between these data input/output pin terminals P3, P4, P7 and P8, pin terminals P5, P6, and P9, P10 respectively for supplying ground voltage VssQ and power supply voltage VddQ utilized by a buffer circuit for data input/output are arranged.

Near the central portion of the package, pin terminals P11 to P17 receiving external control signals are arranged. A write enable signal ZWE is applied to pin terminal P11. A column address strobe signal ZCAS is applied to pin terminal P13. A row address strobe signal ZRAS is applied to pin terminal P15. A chip select signal ZCS is applied to pin terminal P17. A reference potential Vref which serves as a reference for determining high level and low level of an external signal in an input buffer, which will be described later, is applied to pin terminal P12. The reference potential Vref may be used in other form in internal circuitry.

An external clock signal CLK defining an operation timing of the SDRAM is applied to pin terminal P14. A clock enable signal CKE defining whether the external clock signal CLK is valid or invalid is applied to pin terminal P16. External signal is not applied to pin terminal P18, which in turn is kept at a no connection (NC) state.

External address signals Ad are applied to pin terminals P19, P20, P21 and P22 at the lower portion on both sides of the package.

Different from a standard DRAM, in the SDRAM, an internal operation to be executed is defined by the states of external control signals ZWE, ZCAS, ZRAS and ZCS at the rise of clock signal CLK. The manner of operation will be described in the following with reference to FIG. 14.

Referring to (a) of FIG. 14, at a rising edge of clock signal CLK, by setting chip select signal ZCS and row address strobe signal ZRAS to the L level and setting column address strobe signal ZCAS and write enable signal ZWE to the H level, an active command is applied and internal operation of the SDRAM is activated. More specifically, in accordance with the active command, an address signal X is taken in the SDRAM, and memory cell selecting operation in accordance with the address signal X is started.

As shown at (b) of FIG. 14, at a rising edge of clock signal CLK, by setting chip select signal ZCS and column address strobe signal ZCAS to the L level and by setting row address strobe signal ZRAS and write enable signal ZWE to the H level, a read command is applied, and a data reading mode is designated. When the read command is applied, an address signal Y is taken, and in SDRAM, column selection operation on the memory cells in accordance with the address signal Y is performed, so that data Q of the memory cell at the selected row and column is output. Generally, after the lapse of a clock cycle period referred to as "ZCAS latency" after the application of the read command, valid data Q is output. In (b) of FIG. 14, a state in which ZCAS latency is 1 is shown.

Referring to (c) of FIG. 14, at the rising edge of clock signal CLK, by setting chip select signal ZCS, column address strobe signal ZCAS and write enable signal ZWE to the L level and by setting row address strobe signal ZRAS to the H level, a write command is applied. When the write command is applied, data writing operation of the SDRAM is designated, and data D in the clock cycle in which the write command is applied is taken in the SDRAM and then written to the internal selected memory cell designated by the address signals X and Y.

As shown at (d) of FIG. 14, at the rising edge of clock signal CLK, by setting chip select signal ZCS, row address strobe signal ZRAS and write enable signal ZWE to the L level and by setting column address strobe signal ZCAS to the H level, a precharge command is applied. When the precharge command is applied, the inner portions of the SDRAM are returned to the precharge state, and memory cells which have been selected are all brought to non-selected state. Internal circuits of the SDRAM are all returned to the precharged state (standby state).

By taking in the apparatus the external signals, that is, external control signal, address signal and write data in synchronization with the rising edge of the clock signal CLK, internal operation can be started at high speed without the necessity to take into consideration a timing margin caused by a skew of the external signals, whereby high speed access is allowed. Further, since data input/output is performed in synchronization with the clock signal CLK, data can be written/read at high speed. Here, generally in an SDRAM, when a read command or a write command is applied, a number of data, which number is referred to as burst length, can be continuously read or written in accordance with the address signal (Y address) applied at the time of application of the command.

FIG. 15 is a block diagram schematically showing an internal structure of the SDRAM. Referring to FIG. 15, the SDRAM includes a clock buffer 1 for buffering an external clock signal extCLK; a CKE buffer circuit 2 for taking and latching external clock enable signal extCKE in synchronization with an output signal from clock buffer 1 for generating an internal clock enable signal intCKE; and an internal clock generating circuit 4 which is activated when internal clock enable signal intCKE is activated, for generating an internal clock signal intCLK in accordance with an output signal from clock buffer 1. When the internal clock enable signal intCKE is inactive, that is, when it indicates that the external (internal) clock signal is invalid, internal clock generating circuit 4 fixes the internal clock signal intCLK at the L level.

The SDRAM further includes an external signal input buffer circuit 6 for taking in and latching external signals ZCS, ZRAS, ZCAS and ZWE in synchronization with the rise of internal clock signal intCLK for generating an internal control signal; a command decoder 8 for generating a signal designating an operation mode designated in accordance with the internal control signal from external signal input buffer 6; and an internal control signal generating circuit 10 for generating a necessary internal control signal in accordance with an internal operation mode designating signal from command decoder 8. Internal control signal generating circuit 10 also operates in synchronization with internal clock signal intCLK and activate/inactivate various internal control signals in accordance with the internal clock signal intCLK.

The SDRAM further includes a memory cell array 12 including a plurality of memory cells MC arranged in a matrix; an address buffer circuit 14 for taking external address signal bits Ad0 to Adn in synchronization with internal clock signal intCLK for generating an internal address signal; a row selecting circuit 16 which is activated in response to an internal control signal from internal control signal generating circuit 10 for decoding an internal row address signal X from address buffer circuit 14 for selecting a corresponding row of memory cells in memory cell array 12; a column selecting circuit 18 which is activated in response to an internal control signal from internal control signal generating circuit 10 for selecting a column of memory cells in memory cell array 12 in accordance with an internal column address signal Y from address buffer circuit 14; a data input/output buffer circuit 20 for inputting/outputting data to and from the inside of the memory device under the control of internal control signal generating circuit 10; and a read/write circuit 22 for communicating data between the selected memory cell of memory cell array 12 and data input/output buffer 20 under the control of internal control signal generating circuit 10.

In memory cell array 12, a word line WL is arranged corresponding to each row of memory cells, and a bit line pair BLP is arranged corresponding to each column of memory cells MC.

Row selection related circuit 16 includes an X decoder decoding the row address signal X, a word line driver for driving a selected word line WL to the selected state in accordance with an output signal from the X decoder, a sense amplifier for sensing, amplifying and latching data of memory cell MC connected to the selected word line WL, and a circuit for controlling activation/inactivation of the sense amplifier.

Column selection related circuit 18 includes an IO gate provided corresponding to each bit line pair BLP, and an Y decoder decoding the column address signal Y for selecting an IO gate.

Read/write circuit 22 includes a plurality of registers for each of data writing and data reading and performs writing/reading of data in synchronization with internal clock signal intCLK in response to a write/read designating signal applied from internal control signal generating circuit 10.

As described above, internal operation timings are all determined by the internal clock signal intCLK. When the internal clock signal intCLK is fixed at the L level by clock enable signal intCKE, external signal (external write data, address signal bit and external control signal) is not taken in, and internal control signal generating circuit 10 is kept at the state of the previous clock cycle. There is no change in states of internal signals, and hence signal lines are not charged/discharged, so that current consumption can be reduced.

FIGS. 16A and 16B are charts illustrating the function of the external clock enable signal extCKE. Referring to FIG. 16A, in clock cycle 0, when external clock enable signal extCKE is at the H level, internal clock signal intCLK is generated in synchronization with external clock signal extCLK in the next clock cycle 1. The state of internal clock signal intCLK in clock cycle 0 is determined by the state of signal extCKE in the previous clock cycle.

In clock cycle 1, when the external clock enable signal extCKE is set to the L level at the rising edge of external clock signal extCLK, then internal clock intCLK is fixed at the L level in the next clock cycle 2. More specifically, in clock cycle 2, rising of internal clock signal intCLK is inhibited. Therefore, in clock cycle 2, SDRAM is kept at the same state as in clock cycle 1.

FIG. 16B is an illustration representing how external clock enable signal extCKE is utilized upon data writing/reading. In FIG. 16B, external control signals ZCS, ZRAS, ZCAS and ZWE are collectively shown as a command.

When external clock enable signal extCKE is set to the H level and a write command is applied in clock cycle 1, data D0 is taken in at the rising edge of external clock signal extCLK. When external clock enable signal extCKE is set to the L level generation of an internal clock signal in clock cycle 3 is stopped. In this state, even when in clock cycle 2, data D1 is taken in in clock cycle 2 and then external clock signal extCLK rises in clock cycle 3, next data D2 is not taken, since internal clock signal is not generated. Therefore, a CPU (Central Processing unit) which is an external control device applies the same data D2 in the next clock cycle 4. Consequently, in clock cycle 4, an internal clock signal is generated due to returning of the signal extCKE to H level and data D2 is taken in, and in clock cycle 5, data D3 is taken in. In FIG. 16B, burst length is set to 4 as an example. Here, the burst length means the number of data which can be continuously written or read when a write command or a read command is applied. Therefore, at the time of data writing, by keeping external clock enable signal extCKE at the L level for a period of 1 clock cycle, the valid state of data D2 can be made longer, and the write timing of data D3 can be delayed by 1 clock cycle. Even when write data D3 is not prepared by CPU, the data write timing can be delayed until the generation of data D3.

By utilizing external clock enable signal extCKE, when write data are applied continuously at the rising edge of external clock signal extCLK and data D3 is to be written in clock cycle 4 while data D3 is not yet prepared, it becomes possible to delay the writing until data D3 is prepared. Therefore, data can be written in accordance with the operation timing of external CPU.

When a read command is applied in clock cycle 6 and external clock enable signal extCKE is fixed at H level, valid data Q0 is output in clock cycle 10 after the lapse of ZCAS latency, and data Q1, Q2 and Q3 are read in clock cycles 11, 12 and 13, respectively. Here, ZCAS latency is, for example, 3. When external clock enable signal extCKE is set to the L level in clock cycle 7, generation of internal clock signal is stopped in clock cycle 8, data reading operation is stopped for one clock cycle, ZCAS latency is made longer by 1 cycle equivalently, and hence valid data Q0 is output after the lapse of 4 clock cycles, that is, in clock cycle 11.

When external clock enable signal extCKE is set to L level in clock cycle 11 again, generation of internal clock signal is stopped in clock cycle 12, and hence data Q1 which has internally been read in clock cycle 11 and defined in clock cycle 12 is also kept valid in clock cycle 13. Since external clock enable signal extCKE is kept at H level thereafter, in clock cycles 14 and 15, remaining data Q2 and Q3 are read, respectively. Therefore, in this data reading operation also, the data reading timing from the SDRAM can be adjusted according to whether the CPU is ready to receive data.

In addition to the structure providing a delay in the data input/output timing, generation of the internal clock signal is stopped, and hence internal clock signal intCLK can be constantly fixed at the L level by fixing external clock signal extCKE at the L level continuously. Therefore, the internal state of the SDRAM is not changed, and current consumption can be reduced. Especially, taking of an external signal in synchronization with external clock signal extCLK at the time of standby can be stopped, change in the state of internal signals can be prevented, and hence current consumption in the standby state can be reduced.

FIG. 17A shows an example of the structure of clock buffer 1 and internal clock generating circuit 4 shown in FIG. 15. Referring to FIG. 17A, clock buffer 1 includes an input buffer 1a for buffering external clock signal extCLK, and an inverter 1b for inverting an output signal from buffer 1a. A first internal clock signal intCLK0 is output from inverter 1b. An internal clock signal intZCLK0 having complementary logic to external clock signal extCLK is generated from buffer 1a.

Internal clock generating circuit 4 includes an NOR circuit 4a receiving internal clock enable signal intCKE from CKE buffer 2 and internal clock signal intZCLK0 from buffer 1a, and an inverter 4b inverting an output signal from NOR circuit 4a'. From NOR circuit 4a', internal clock signal intCLK as a second internal clock signal is output, and a complementary internal clock signal intZCLK is output from inverter 4b.

FIG. 17B shows an example of a structure of CKE buffer 2 shown in FIG. 15. Referring to FIG. 17B, CKE buffer 2 includes a buffer 2a buffering external clock enable signal extCKE, a first latch circuit 2b for latching and outputting an output signal from buffer 2a in synchronization with internal clock signal intCLK0, and a second latch circuit 2c for latching and outputting an output signal from the first latch circuit 2b in synchronization with internal clock signal intZCLK0.

The first latch circuit 2b includes a tristate inverter 21a which is selectively activated by internal clock signals intCLK0 and intZCLK0. The tristate inverter 21a is activated when internal clock signal intCLK0 is at the L level, and it inverts a signal applied from buffer 2a. When internal clock signal intCLK0 is at the H level, the tristate inverter 21a is inactivated and set to an output high impedance state.

The first latch circuit 2b further includes an inverter 21b receiving an output signal from tristate inverter 21a, an inverter 21c for inverting and transmitting an output signal from inverter 21b to an input portion of inverter 21b, an inverter 21d receiving an output signal from inverter 21b, an NAND circuit 21e receiving internal clock signal intCLK0 and an output signal from inverter 21d, an NAND circuit 21 receiving internal clock signal intZCLK0 and an output signal from inverter 21b, an NAND circuit 21g receiving at one input an output signal from NAND circuit 21e, and an NAND circuit 21h receiving an output signal from NAND circuit 21f and an output signal CKE0 from NAND circuit 21g. An output signal from NAND circuit 21h is applied to another input of NAND circuit 21e. NAND circuits 21g and 21h constitute a flipflop.

The second latch circuit 2c includes an NAND circuit 22a receiving internal clock signal intZCLK0 and an output signal CKE0 from NAND circuit 21g, an NAND circuit 22b receiving internal clock signal intZCLK0 and an output signal CKE0 from NAND circuit 21h, an NAND circuit 22c receiving at one input an output signal from NAND circuit 22a, and an NAND circuit 22d receiving an output signal from NAND circuit 22b and an output signal from NAND circuit 22c for outputting a complementary internal clock enable signal intZCKE. The internal clock enable signal intCKE output from NAND circuit 22d is applied to another input of NAND circuit 22c. Internal clock enable signal intZCKE is output from NAND circuit 22c. NAND gates 22c and 22d constitute a flipflop. The operations of the clock buffer and the internal clock generating circuit shown in FIG. 17A as well as the operation of the CKE buffer shown in FIG. 17B will be described with reference to FIG. 18, which is a diagram of waveforms.

In clock cycle 0, when external clock signal extCLK rises to the H level while the external clock enable signal extCKE is at the H level, internal clock signal intZCLK0 from input buffer 1a of clock buffer 1 is set to the L level, and the output signal from inverter 1b rises to the H level. Meanwhile, in CKE buffer 2, the output signal from buffer 2a is at the L level, as buffer 2a has an inverting function. In the first latch circuit 2b, the tristate inverter 21a is set to the output high impedance state in response to the rise of internal clock signal intCLK0, and the H level signal applied before the rise of internal clock signal intCLK0 is latched by inverters 21b and 21c.

Each of NAND circuits 21e and 21f functions as an inverter in response to the rise of internal clock signal intCLK0, and these circuits invert signals applied from inverters 21d and 21b, and apply inverted signals to NAND circuits 21g and 21h, respectively. In this state, the output signal from NAND circuit 21e attains to the L level, and in response, the signal CKE0 from NAND circuit 21g attains to the H level. In the second latch circuit 2c, internal clock signal intZCLK0 falls to the L level. Therefore, output signals from NAND circuits 22a and 22b attain to the H level, and the second latch circuit 2c is set to a latch state in which a signal applied before the fall of internal clock signal intZLK0 is maintained. In this state, internal clock enable signal intCKE is at the H level, while the complementary internal clock enable signal intZCKE is at the L level. Therefore, in internal clock generating circuit 4, NOR circuit 4a' functions as an inverter, and it inverts the signal applied from buffer 1a of clock buffer 1 and generates internal clock signal intCLK. The states of signals intCKE and intZCKE are defined in response to the rise of internal clock signal intZCLK. Therefore, in clock cycle 0, whether or not internal clock signal intCLK is generated is determined dependent on the state of external clock enable signal extCKE of the previous cycle.

In clock cycle 1, external clock enable signal extCKE is set to the L level at the rising edge of external clock signal extCLK. In this state, internal clock signal intCLK0 rises to the H level in accordance with external clock signal extCLK, the first latch circuit 2b latches external clock enable signal extCKE applied from buffer 2a and outputs the same. Therefore, the output signal CKE0 from the first latch circuit 2b falls to the L level in response to the rise of internal clock signal intCLK0. Meanwhile, the second latch circuit 2c is at the latch state since internal clock signal intZCLK0 is at the L level, and hence it keeps the internal clock enable signal intCKE at the H level and the complementary internal clock enable signal intZCKE at the L level.

Therefore, in clock cycle 1, NOR circuit 4a' functions as an inverter, and in accordance with a signal from buffer 1a, internal clock signal intCLK is generated. In clock cycle 1, when internal clock signal intCLK0 (external clock signal extCLK) falls to the L level, in the first latch circuit 2b, tristate inverter 21a is activated, and it inverts the H level signal from buffer 2a. However, NAND circuits 21d and 21f keep the output signals therefrom at the H level because of the internal clock signal intCLK0 at the L level, and hence the output states of NAND circuits 21g and 21h are not changed. Therefore, the output signal CKE0 from the first latch circuit 21b is kept at the L level. Meanwhile, the second latch circuit is set to the through state in response to the rise of internal clock signal intZCLK0, and it passes and latches the signal applied from the first latch circuit 2b. In response, internal clock enable signal intCKE attains to the L level, and the complementary internal clock enable signal intZCKE attains to the H level.

As a result, in the internal clock generating circuit 4, the output signal from NOR circuit 4a' is fixed at the L level, and internal clock signal intCLK is fixed at the L level. The second latch circuit 2c maintains the internal clock enable signal intCKE at the L level until the internal clock signal intZCLK0 again rises to the H level (that is, until the internal clock signal intCLK0 falls to the L level). Therefore, in clock cycle 2, even if internal clock signal intCLK0 rises in accordance with external clock signal extCLK, NOR circuit 4a' has its output signal fixed at the L level, and rising (generation) of internal clock signal intCLK is inhibited.

In clock cycle 2, when external clock enable signal extCKE is at the H level, the first latch circuit 2b is set to the latch state in response to the rise of internal clock signal intCLK0, and in accordance with the signal at the H level taken in by that time, it returns the output signal CKE0 to the H level.

Therefore, when the second latch circuit 2c is set to the through state in response to the fall of internal clock signal intCLK0, internal clock enable signal intCKE is set to the H level, and the complementary internal clock signal intZCKE is set to the L level. Therefore, in clock cycle 3, internal clock signal intCLK rises to the H level in accordance with the rise of external clock signal extCLK.

As described above, in the first latch circuit 2b, the external clock enable signal is latched and shifted in accordance with internal clock signal intCLK0 and the output signal from the first latch circuit 2b is shifted in the second latch circuit 2c in accordance with the internal clock signal intZCLK0. Therefore, the internal clock enable signal intCKE changes with a delay of a half cycle of external clock signal extCLK, and the changed of state is maintained for 1 clock cycle. Accordingly, after the fall of the internal clock signal intCLK, the internal clock signal intCLK can be surely kept at the L level during the next clock cycle. Further, the second latch circuit is released of the latch state and it is set to the through state in response to the fall of internal clock signal intCLK0. Therefore, when the external clock enable signal extCKE is set at the H level, the internal clock signal intCLK can be surely kept at the active state of H level in the next clock cycle.

As described above, the external clock enable signal extCKE is shifted successively in accordance with the internal clock signal intCLK0 by first and second latch circuits 2b and 2c. Therefore, when the external clock enable signal extCKE is set to the L level indicating invalid state of the external clock signal, in the next clock cycle, internal clock signal intCLK can be surely fixed at the L level.

As the speed of operation of various semiconductor devices as components of a system has been increased, new standard of interfaces have been proposed so as to allow high speed signal propagation in the system. Such new standards include GTL (Gunning Transceiver Logic), CTT (Center Tapped Terminated), HSTL (High Speed Transceiver Logic) and SSTL (Stub Series Terminated Logic or Stub Series Terminated Transceiver Logic). In these interfaces, amplitude of an input signal is made smaller, time for charging/discharging signal lines is made shorter so as to reduce power consumption and to increase a speed of operation. For example, in HSTL and CTT, the amplitude of an input signal is determined to be within the range of reference voltage Vref ±0.2 V. Therefore, an input buffer provided at a receiving side element must amplify the signal having such a small amplitude. In these new standards, the H and L level amplitudes are defined relative to the reference voltage, and hence an input buffer must have a differential amplifying circuit.

FIG. 19 shows a structure of a first stage of a conventional input buffer. Here, the first stage of an input buffer means a buffer circuit portion directly receiving an external signal, which corresponds to buffer 1a or 2a.

Referring to FIG. 19, the input buffer of the first stage includes a p channel MOS transistor PQ1 having one conduction node (source) connected to a power supply node supplying power supply voltage Vdd and a gate and another conduction node (drain) connected to a node N1; a p channel MOS transistor PQ2 having one conduction node connected to the power supply node, a gate connected to node N1 and another conduction node connected to an output node N2; an n channel MOS transistor NQ1 having one conduction node connected to a ground node supplying ground voltage Vss, a gate connected to receive a reference voltage Vref and another conduction node connected to node N1; and an n channel MOS transistor NQ2 having one conduction node connected to the ground node, a gate connected to receive an external signal EXT and another conduction node connected to output node N2. In the structure of the input buffer of the first stage, p channel MOS transistors PQ1 and PQ2 constitute a current mirror circuit. External signal EXT may be any of externally applied control signals ZCS, ZRAS, ZCAS and ZWE, address signal Add and write data D.

If the external signal EXT is higher than the reference potential Vref, conductance of n channel MOS transistor NQ2 becomes larger than that of n channel MOS transistor NQ1. MOS transistor NQ1 receives current from p channel MOS transistor PQ1, and a current of the same magnitude as the current flowing through p channel MOS transistor PQ1 flows through p channel MOS transistor PQ2 (provided that MOS transistors PQ1 and PQ2 are of the same size). Therefore, in this state, the current flowing through MOS transistor PQ2 is all discharged to the ground node through MOS transistor NQ2, and node N2 attains to the L level.

Meanwhile if the potential level of external signal EXT is lower than the reference voltage Vref, conductance of n channel MOS transistor NQ1 becomes larger than that of MOS transistor NQ2. In this case, the current flowing through p channel MOS transistor PQ2 becomes larger than the current flowing through n channel MOS transistor NQ2, and the potential level at node N2 is set to the H level.

By using such a differential amplifying circuit as shown in FIG. 19 in the input buffer of the first stage, it becomes possible to generate an internal signal ZOUT having large amplitude, by high speed amplification, even when the external signal EXT has a small amplitude.

The reference voltage Vref is generally at the potential level of an intermediate voltage (Vdd+Vss)/2 between the power supply voltage Vdd and the ground voltage Vss. The amplitude of the external signal EXT is as small as Vref ±0.2 (in case of HSTL and CTT interface: in GTL, it is Vref ±0.05). However, even when the potential level of external signal EXT is fixed at the level of the power supply voltage Vdd or of the ground voltage Vss such as at the time of standby, the reference voltage Vref is at the intermediate potential level, and hence in the differential amplifying circuit, current always flows from the power supply node to the ground node. More specifically, when the external signal EXT is at the level of the power supply voltage Vdd, current flows to the ground node through MOS transistor NQ2, and when the external signal EXT is at the level of the ground voltage Vss, current flows to the ground node through MOS transistor NQ1.

When the storage capacity of SDRAM increases, the number of input buffers receiving the address signal bits will be increased, and if data of multiple bits are to be input/output, the number of data input buffers will be increased as well. Further, as the SDRAM comes to have many functions, kinds of external control signals will be increased. Therefore, when the number of external signals are increased in this manner, the number of input buffers will be increased accordingly, and if such a differential amplifier circuit as shown in FIG. 19 is used in the input buffer of the first stage, the current constantly flowing through the differential amplifying circuit becomes large, which hinders implementation of an SDRAM having low current consumption.

SUMMARY OF THE INVENTION

An object of the present invention is to provide a clock synchronous semiconductor memory device which allows significant reduction in current consumption by the input buffer.

Another object of the present invention is to provide a clock synchronous semiconductor memory device which can surely reduce current consumption at an input buffer without affecting access operation even when the external clock signal has a high frequency.

The synchronous semiconductor memory device in accordance with the present invention includes a clock buffer circuit generating a first internal clock signal in accordance with an externally applied external clock signal; a latch circuit latching an externally applied external clock enable signal indicating validity of the external clock signal in synchronization with the first internal clock signal for generating an input buffer enable signal which is activated when the external clock enable signal is active; a clock enable circuit for generating an internal clock enable signal by providing a delay to the input buffer enable signal; an internal clock generating circuit which is activated when the internal clock enable signal is active, for generating a second internal clock signal in accordance with the external clock signal; an input buffer circuit which is activated when the input buffer enable signal is active, for buffering an externally applied signal; and an internal signal generating circuit for latching an output signal from the input buffer circuit in synchronization with the second internal clock signal for generating an internal signal.

The input buffer circuit includes a component which operates using voltages on first and second power supply nodes as operational power supply voltages, and for shutting off a current path between first and second power supply nodes when the input buffer enable signal is inactive.

The external clock signal changes between first and second potential levels. The latch circuit latches and outputs an externally applied external clock enable signal indicating validity of the external clock signal in synchronization with the change from the first potential level to the second potential level of the first internal clock signal. The internal signal generating circuit has substantially the same structure as the latch circuit, and it latches the signal from the input buffer circuit in response to a change from the first to the second potential level of the second internal clock signal, and generates and outputs an internal signal.

The input buffer enable signal is generated in response to external clock enable signal in accordance with the first internal clock signal, and current path of the input buffer circuit is shut off in accordance with the input buffer enable signal. The input buffer enable signal is generated in accordance with the external clock enable signal, and in the cycle in which generation of the second internal clock signal is stopped, the inside of the device is maintained at the state of the previous cycle. Therefore, it is not necessary to take in an external signal. Therefore, the input buffer circuit is set to the operative state only when necessary, and current path of the input buffer circuit is shut off when not necessary. Therefore, current consumption can be reduced without affecting the circuit operation.

Further, the input buffer enable signal is generated in accordance with the external clock enable signal in synchronization with the first internal clock signal. Therefore, in a cycle in which the external clock enable signal is activated, that is, in the cycle in which the internal clock signal returns from an invalid state to a valid state, the input buffer enable signal changes in accordance with the external clock enable signal in the cycle in which the internal clock signal is made invalid. Accordingly, it becomes possible to activate the input buffer enable signal before application of the external signal to be taken in (before the set up) and to set the input buffer circuit to the operative state. Therefore, set up time of the external signal can be ensured even at an operation at high speed, and an internal signal can be surely generated in accordance with the external signal.

Further, since the latch circuit and the internal signal generating circuit have substantially the same structure with each other, when the state of the input buffer enable signal is defined, the external signal has been already taken in and the internal signal has been made definite. Therefore, the necessary external signal can be surely taken in the device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13 shows an external pin arrangement of an SDRAM.

FIG. 14 is a timing chart showing the operation of the SDRAM.

FIG. 18 is a timing chart showing the operation of the structures shown in FIGS. 17A and 17B.

FIG. 19 shows an example of a structure of a first stage of the input buffer in a conventional SDRAM.

DESCRIPTION OF THE PREFERRED EMBODIMENTS

[Starting Point of the Invention]

Figure 1:
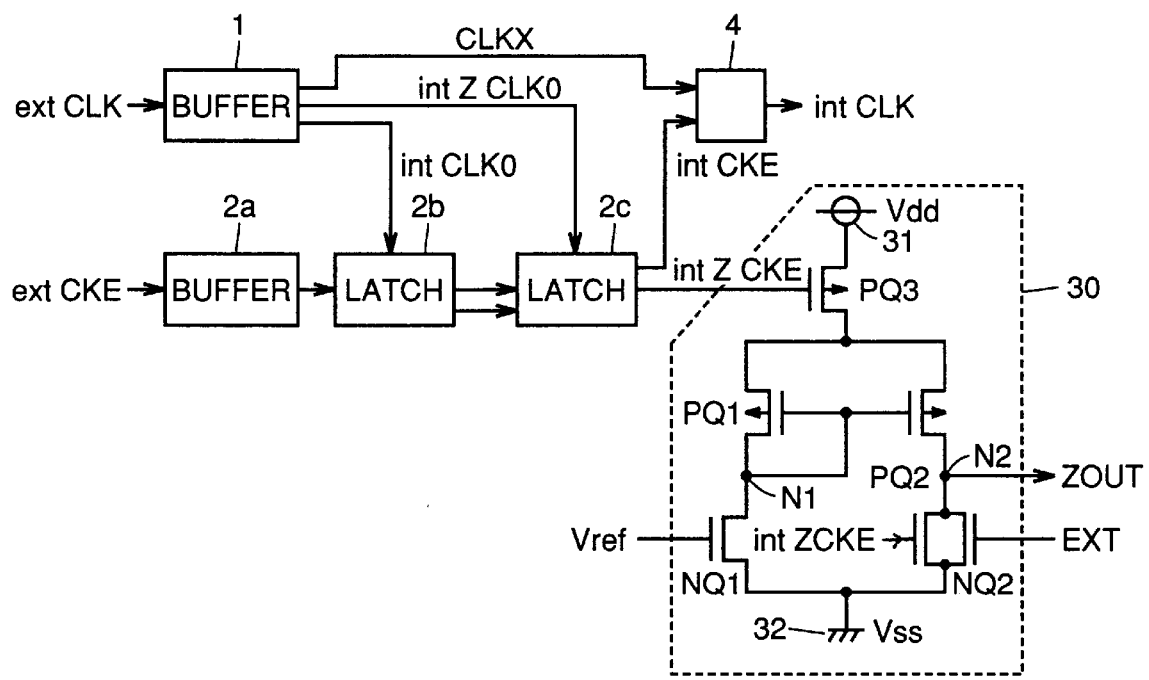
FIG. 1 shows a structure of a starting SDRAM in accordance with an embodiment of the present invention.

FIG. 1 shows a structure of a main portion of the SDRAM, as a starting point of the present invention. Referring to FIG. 1, the SDRAM includes a clock buffer circuit 1 for buffering an external clock signal extCLK for generating an intermediate clock signal CLKX and first internal clock signals intCLK0 and intZCLK0; and an internal clock generating circuit 4 which is selectively activated in accordance with internal clock enable signal intCKE for generating a second internal clock signal intCLK from the intermediate clock signal CLKX. The structures of the circuits 1 and 4 will be described in greater detail later. Internal clock signals intCLK0 and intZCLK0 are generated by buffering intermediate clock signal CLKX.

The SDRAM further includes a buffer circuit 2a for buffering external clock enable signal extCKE; a first latch circuit 2b for latching and outputting an output signal from buffer circuit 2a in synchronization with the first internal clock signal intCLK0; and a second latch circuit 2c for latching and outputting an output signal from the first latch circuit 2b in synchronization with the first internal clock signal intZCLK0. From the second latch circuit 2c, internal clock enable signals intCKE and intZCKE are output. Structures of buffer circuit 2a and latch circuits 2b and 2c are the same as those shown in FIG. 17B. When the clock enable signal intCKE is at the H level, valid state of the external clock signal (internal clock signal) is instructed, and when the internal clock enable signal intCKE is at the L level, invalid state of the external clock signal (internal clock signal) is instructed.

Input buffer 30 differentially amplifies reference voltage Vref and an external signal (any of control signals, address signals and write data) EXT, to generate an output signal ZOUT. Similar to the input buffer of the first stage shown in FIG. 19, input buffer circuit 30 includes p channel MOS transistors PQ1 and PQ2 constituting a current mirror circuit, and n channel MOS transistors NQ1 and NQ2 constituting a comparing stage for comparing the reference voltage Vref and external signal EXT.

Figure 2:
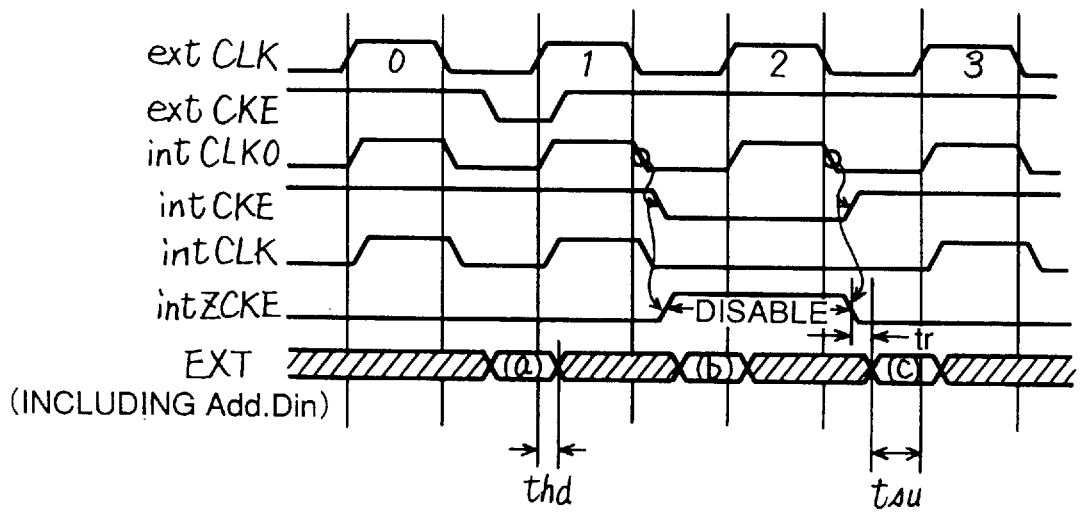
FIG. 2 is a timing chart showing the operation of the structure shown in FIG. 1.

Input buffer 30 further includes a p channel MOS transistor PQ3 connected between power supply node 31 and one conduction node of each of p channel MOS transistors PQ1 and PQ2 and receiving at its gate internal clock enable signal intZCKE; and an n channel MOS transistor NT provided parallel to MOS transistor NQ2 and receiving internal clock enable signal intZCKE at its gate. The operation of the structure shown in FIG. 1 will be described with reference to FIG. 2, which is a diagram of operational waveforms. In a clock cycle before clock cycle 0, it is assumed that external clock enable signal extCKE is set at the H level.

In clock cycle 0, external clock enable signal extCKE is set to the H level, designating validity of the external clock signal extCLK. In this state, since external clock enable signal extCKE has been held at the H level in the previous clock cycle, where internal clock signal intCLK is generated from clock buffer circuit 1, the internal clock signal intCLK is generated from internal clock generating circuit 4 in accordance with the first internal clock signal intCLK0. Here, the term "generated" means that the clock signal rises from the L level (first potential level) to the H level (second potential level). In this state, in input buffer 30, p channel MOS transistor PQ3 is kept conductive as internal clock enable signal intZCKE is at the L level, and hence it compares external signal EXT with reference voltage Vref and generates an output signal ZOUT in accordance with the result of comparison.

In clock cycle 1, external clock enable signal extCKE is set to the L level, designating invalidity of external clock signal extCLK. In this state, internal clock signal intCLK0 is generated from clock buffer 1 and applied to latch circuits 2b and 2c. As already described, latch circuits 2b and 2c transmit external clock enable signal extCKE with a delay of a half clock cycle. Therefore, while the internal clock signal intCLK0 is at the H level, latch circuit 2c is kept at the previous cycle state, and internal clock enable signal intZCKE maintains the L level. Therefore, internal clock signal intCLK is generated, input buffer circuit 30 operates and external signal EXT and reference voltage Vref are compared.

In clock cycle 1, when the first internal clock signal intCLK0 falls to the L level, latch circuit 2c is set to the through state, and it takes in and outputs the signal applied from the first latch circuit 2b. Therefore, in this state, internal clock enable signal intZCKE attains to the H level, p channel MOS transistor PQ3 is rendered non-conductive, and n channel MOS transistor NT is rendered conductive. Consequently, a current path from power supply node 31 to ground node 32 through input buffer circuit 30 is shut off. Output signal ZOUT is discharged by MOS transistor NT, and maintains the L level. By MOS transistor NT, the signal ZOUT is prevented from being susceptible to noise as the output node N2 is not set to the high impedance state even when the external signal EXT is at the L level. In clock cycle 1, the external signal EXT ((a)) applied at a rising edge of external clock signal extCLK is taken in, and internal operation is executed.

When external clock signal extCLK rises to the H level in clock cycle 2, the first internal clock signal intCLK0 rises to the H level in response. In this state, external clock enable signal extCKE has been returned to the H level, and designates valid state of external clock signal extCLK. However, latch circuit 2c is maintained in the latch state by the internal clock signal intZCLK0 which is at the L level, and internal clock enable signal intZCKE is kept at the H level. Similarly, internal clock enable signal intCKE is at the inactive state of L level, and the internal clock signal intCLK from internal clock generating circuit 4 is kept at the L level.

In this state, internal operation does not take place, and hence it is not necessary to take in the external signal EXT ((b)) applied in clock cycle 2. Therefore, even when p channel MOS transistor PQ3 in input buffer 30 is rendered non-conductive and the input buffer circuit 30 is set to the inoperative state, there is no undesirable influence on the internal operation.

When internal clock signal intCLK0 falls to the L level in clock cycle 2, the first latch circuit 2b is set to the latch state, the second latch circuit 2c is set to the through state, internal clock signal intCKE is set to the H level in accordance with the external clock enable signal extCKE, and the complementary internal clock enable signal intZCKE is set to the L level. Consequently, p channel MOS transistor PQ3 is rendered conductive, n channel MOS transistor NT is rendered non-conductive, and input buffer circuit 30 is set to the operative state.

Therefore, it becomes possible in clock cycle 3 to take in the external signal EXT at the rising edge of external clock signal extCLK, to amplify the taken signal by input buffer circuit 30 to generate an internal signal, and to perform internal operation.

With respect to the rise of external clock signal extCLK, a set up time tsu and hold time thd of the external signal EXT are defined. These times are defined as it is necessary to keep the external signal at the defined state in order to generate an internal signal correctly. Internal clock enable signal intZCKE changes in accordance with the fall of internal clock signal intCLK0. Therefore, the hold time thd of external signal EXT ((a)) in clock cycle 1 is ensured. Therefore, the external signal EXT ((a)) in clock cycle 1 can be accurately taken in. As for the external signal EXT ((b)) applied in clock cycle 2, the external signal is taken in and generated in synchronization with the internal clock signal intCLK. Therefore, taking of the external signal EXT ((b)) can be surely prevented.

Further, when the external clock signal extCLK returns from the invalid state to the valid state, that is, upon transition from clock cycle 2 to clock cycle 3, the time point when the internal clock enable signal intZCKE attains to the L level corresponds to the time of fall of internal clock signal intCLK0, which is an earlier time point than the start of set up of the external signal EXT which is to be taken in clock cycle 3. Therefore, set up time tsu can be ensured for the external signal EXT ((c)), and hence the external signal EXT ((c)) can be surely taken in and an internal signal can surely be generated. Further, by generating internal clock signals intCLK0 and intCLK by buffering intermediate clock signal CLKX, it becomes possible to generate internal clock signal intCLK at an earlier timing, and hence the timing of starting internal operation can be made earlier.

If the external clock signal extCLK is relatively slow and the time difference tr between the timing of transition of internal clock enable signal intZCKE to the L level and the time point of starting the set up of the external signal EXT ((c)) is positive, it is also possible to take in the external signal EXT and to generate internal signal accurately, even in such a case in which the operation of the input buffer circuit 30 is stopped when not necessary and then the input buffer circuit is returned to the operative state thereafter.

However, if the external clock signal extCLK is a high speed clock signal and the set up time tsu for the external signal EXT becomes close to half the cycle time of external signal extCLK, accurate taking of external signal EXT may not be possible. Such condition will be described with reference to FIG. 3.

Figure 3:
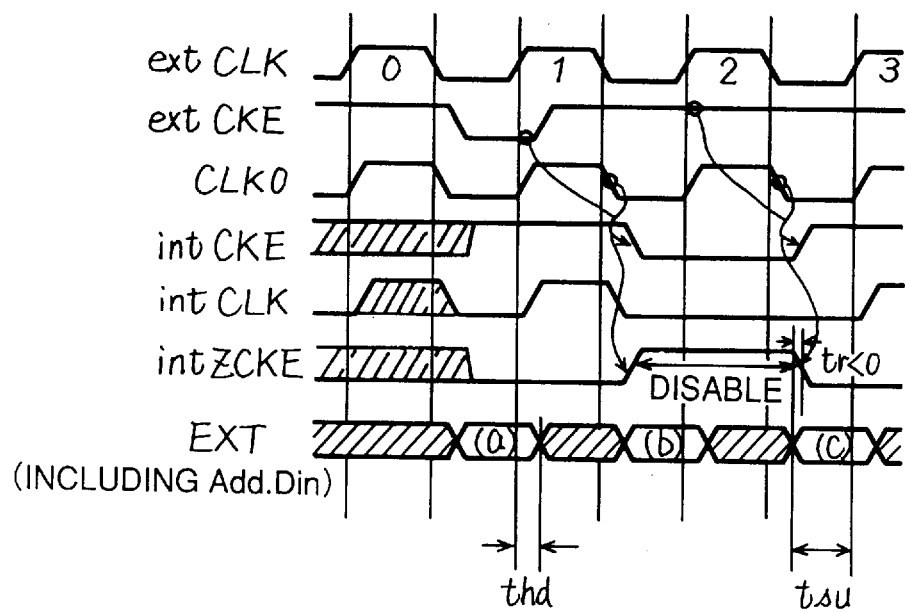
FIG. 3 is a timing chart representing the problem of the structure shown in FIG. 1.

Referring to FIG. 3, the states of signals intCKE, intZCKE and intCLK in clock cycle 0 are determined by the state of external clock enable signal extCLK of the previous clock cycle. In clock cycle 1, external clock enable signal extCKE is set to the L level, and generation of internal clock signal intCLK in clock cycle 2 is stopped. In clock cycle 3, internal clock signal intCLK is generated again. In clock cycle 2, after the lapse of a delay time in the second latch circuit 2c from the fall of the first internal clock signal CLK0 to the L level, the internal clock enable signal intZCKE changes to the L level. Meanwhile, at this time, the external signal EXT ((c)) which is to be taken in the clock cycle 3 is set up. The hold time thd and the set up time tsu are of constant values determined in accordance with the specification. If the external clock signal extCLK has a short period, it is possible that the internal clock enable signal intZCKE is set to the L level after the external signal EXT ((c)) has been set up. If the time difference (hereinafter referred to as a reset time) tr between the time at which the internal clock enable signal intZCKE is set to the L level and the timing at which the external signal EXT is set up becomes negative, the set up time tsu of the external signal EXT becomes effectively shorter, and hence it may not be possible to take in the external signal EXT ((c)) and to generate an internal signal accurately.

In the following, a structure which surely allows taking in of an external signal even when the device operates in synchronization with a high speed clock signal will be described.

[First Embodiment]

Figure 4:
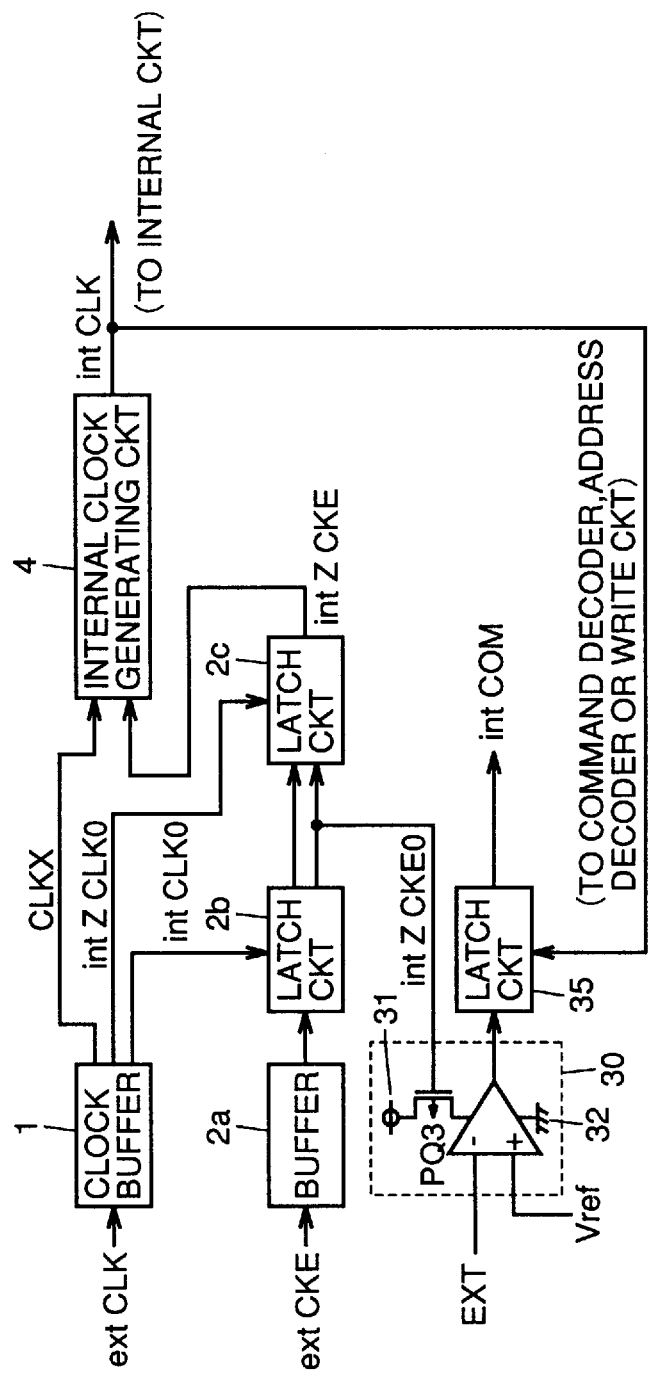
FIG. 4 shows a structure of a main portion of the SDRAM in accordance with an embodiment of the present invention.
Figure 15:
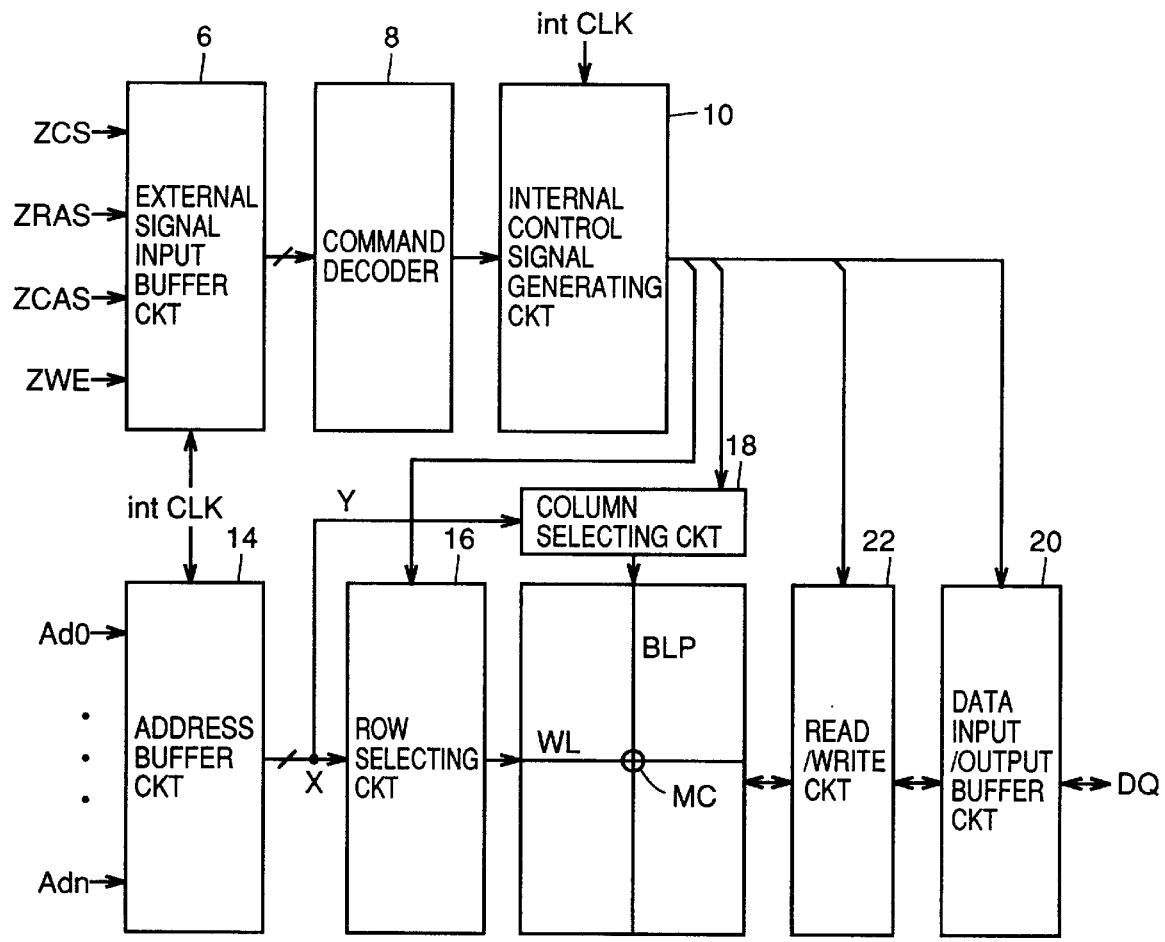
FIG. 15 schematically shows a whole structure of the SDRAM.
Figure 15:
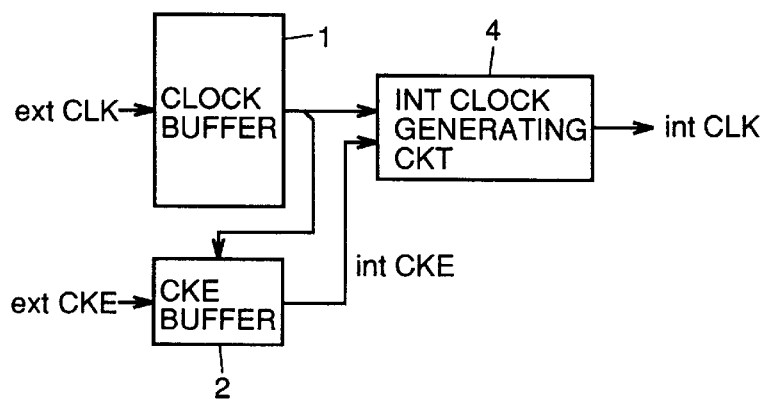
Figure 16A:
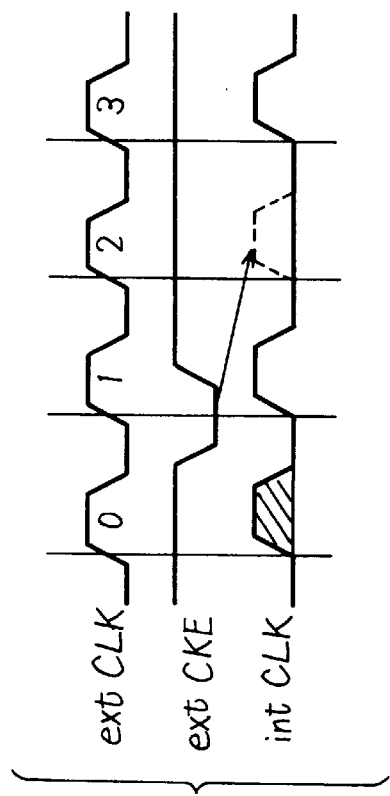
FIG. 16A is a timing chart used for describing difference in clock enable signal.
Figure 16B:
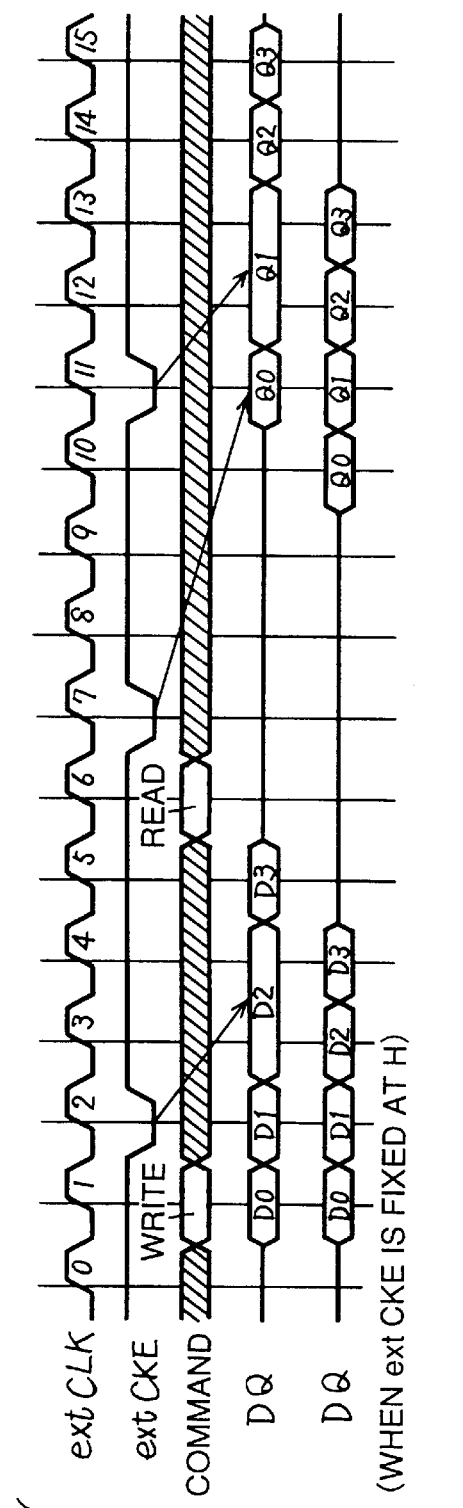
FIG. 16B is a timing chart showing an example of the use of the clock enable signal.

FIG. 4 shows a structure of a main portion of an SDRAM in accordance with a first embodiment of the present invention. In FIG. 4, portions corresponding to those of FIG. 1 are denoted by the same reference characters and detailed description thereof is not repeated. In the structure shown in FIG. 4, to the gate of p channel MOS transistor PQ3 for shutting off a current path of input buffer circuit 30 receiving external signal EXT, an output signal intZCKE0 from the first latch circuit 2b is applied as an input buffer enable signal. The internal clock enable signal intZCKE from the second latch circuit 2c is applied to internal clock generating circuit 4, to control validity/invalidity of the internal clock signal intCLK. An output signal from input buffer circuit 30 is applied to a latch circuit 35 which is set to a latch state in response to internal clock signal intCLK from internal clock generating circuit 4. Latch circuit 35 takes in a signal applied from input buffer circuit 30 in accordance with the rise of internal clock signal intCLK, and it latches the signal while the internal clock signal intCLK is at the L level. An internal signal intCOM from latch circuit 35 is any of an internal control signal (corresponding to external control signals generating a command), an address signal bit or an internal write data, which is applied to command decoder, address decoder or write circuit, respectively (see FIG. 15).

The operation of the structure shown in FIG. 4 will be described with reference to FIG. 5, which is a timing chart thereof.

The states of signals intCKE and intCLK in clock cycle 0 are determined by the state of external clock enable signal extCKE of the previous clock cycle.

In clock cycle 1, the external clock enable signal extCKE is set to the L level at the rise of the external clock signal extCLK, designating invalidity of the external clock signal. Internal clock signal intCLK0 from clock buffer 1 rises to the H level in synchronization with the rise of external clock signal extCLK. In synchronization with the rise of internal clock signal intCLK0, latch circuit 2b takes and latches the signal applied from buffer circuit 2a, and it is set to the latch state in response to the fall of internal clock signal intCLK0. Therefore, input buffer enable signal intZCKE0 from latch circuit 2b rises to the H level when the internal clock signal intCLK0 rises, and renders nonconductive the p channel MOS transistor PQ3 for shutting off current path of input buffer circuit 30.

Latch circuit 35 has substantially the same structure as latch circuit 2b, and the detailed structure will be described later. The latch circuit 35 is set to the through state when internal clock signal intCLK rises to the H level, takes the signal applied from input buffer circuit 30 and it is set to the latch state when internal clock signal intCLK is at the L level. At the time point when the input buffer enable signal intZCKE0 rises to the H level, the output signal from input buffer circuit 30 has been already taken in the latch circuit 35, and internal signal intCOM is at a state corresponding to the external signal EXT.

When the internal clock signal intCLK0 falls to the L level, latch circuit 2c is set to the through state, the internal clock enable signal intZCKE attains to the H level in accordance with the output signal from latch circuit 2b (internal clock enable signal intCKE attains to the L level), internal clock generating circuit 4 is disabled, to fix the internal clock signal intCLK at the L level. Therefore, in clock cycle 2, even when the first internal clock signal intZCLK0 changes in accordance with the external clock signal extCLK, internal clock signal intCLK from internal clock generating circuit 4 is kept at the L level. In clock cycle 2, external clock enable signal extCKE has been returned to the H level, latch circuit 2b is set to the through state in response to the rise of internal clock signal intCLK0, and it returns the input buffer enable signal intZCKE0 to the L level. Consequently, p channel MOS transistor PQ3 is rendered conductive and input buffer circuit 30 is set to the operative state. At this time, external signal EXT ((b)) is not taken in the latch circuit 35 (internal clock signal intCLK is fixed at the L level). Therefore, internal signal intCOM maintains the state (a) which corresponds to the external signal EXT ((a)) applied in the previous clock cycle 1.

Thereafter, when internal clock signal intCLK0 attains to the L level in accordance with external clock signal extCLK, latch circuit 2c is set to the through state, internal clock enable signal intZCKE returns to the L level (internal clock enable signal intCKE to the H level) in accordance with the input buffer enable signal intCKE0 at the L level, and internal clock generating circuit 4 is set to the operative state.

Even when the timing at which internal clock enable signal intCKE rises to the H level is later than the set up timing of external signal EXT ((c)) to be taken in the next clock cycle 3, the input buffer enable signal intZCKE0 has been already returned to the active level of L, the reset time tr of approximately half a clock cycle period is ensured, and hence input buffer circuit 30 can surely buffer the external signal EXT for application to the latch circuit 35. Therefore, by utilizing the signal intZCKE0 from latch circuit 2b operating in synchronization with the first internal clock signal intCLK0 as the input buffer enable signal, the reset time tr can be ensured even when the external clock signal extCLK is a high speed clock signal. Therefore, even at a high speed operation, current consumption can be reduced, and the external signal can be surely taken in to generate an internal signal.

In clock cycle 3, internal clock signal intCLK rises in synchronization with the rise of internal clock signal intCLK0, latch circuit 35 takes in the external signal EXT ((c)) applied from input buffer circuit 30, and outputs an internal signal intCOM ((c)).

As described above, by utilizing the signal intZCKE0 which changes in synchronization with the first internal clock signal intZCLK0 at an earlier timing than internal clock signal intZCKE as an input buffer enable signal to shut off the current path between power supply nodes (including both power supply node 31 and ground node 32) of input buffer circuit 30, the set up time of the external signal can be ensured while the input buffer circuit is operated only when necessary even in a high speed operation, and it becomes possible to correctly take in the external signal EXT to generate the internal signal intCOM. Therefore, an SDRAM which can operate at high speed with low current consumption can be obtained.

[Structure of a Clock Buffer Circuit]

Figure 6:
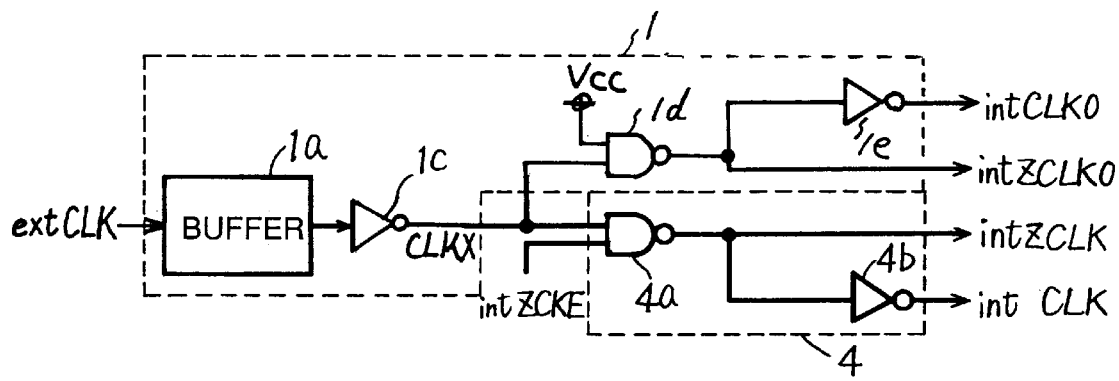
FIG. 6 shows an example of a structure of a clock buffer circuit shown in FIG. 4.

FIG. 6 shows an example of structures of clock buffer circuit 1 and internal clock generating circuit 4 shown in FIG. 4. Referring to FIG. 6, clock buffer 1 includes a buffer circuit 1a for receiving and buffering external clock signal extCLK, an inverter 1c inverting an output signal from buffer circuit 1a, an NAND circuit 1d receiving power supply voltage Vcc and an output signal from inverter 1c, and an inverter 1e for inverting an output from NAND circuit 1d. Complementary first internal clock signal intZ-CLK0 is output from NAND circuit 1d, and first internal clock signal intCLK0 is output from inverter 1e. Buffer circuit 1a has a structure of, for example, a current mirror type differential amplifying circuit. Buffer circuit 1a is always in operation and it buffers, inverts and outputs the external clock signal extCLK.

Figure 5:
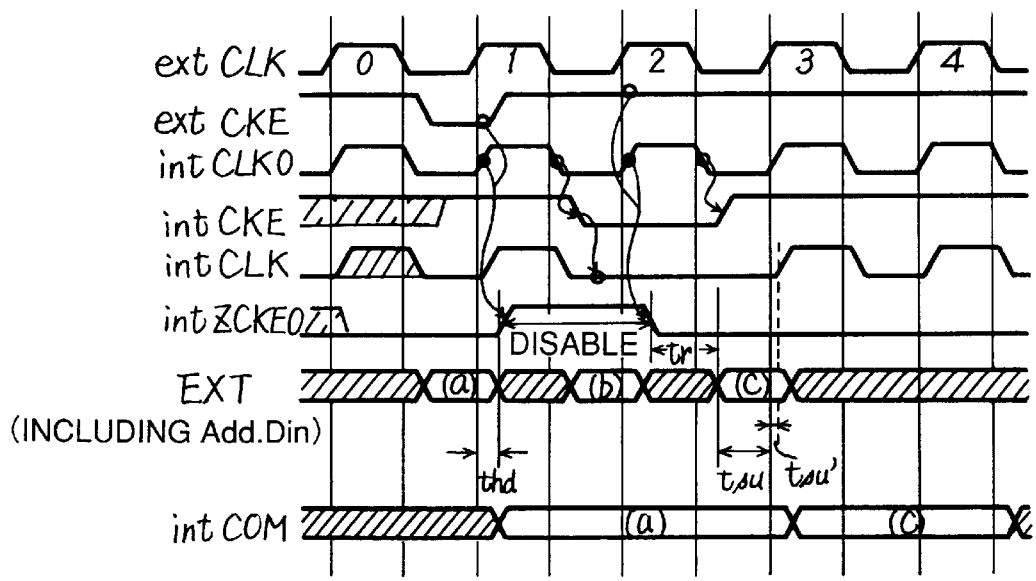
FIG. 5 is a timing chart representing an operation of the structure shown in FIG. 4.

As shown in FIG. 5, when the rise of internal clock signal intCLK is delayed by inverter 1c, the delay time tsu' of inverter 1c is added as effective set up time, to the set up time tsu of external signal EXT, since external signal EXT is taken in and latched in synchronization with internal clock signal intCLK. Therefore, even if the set up time tsu of external signal EXT with respect to the external clock signal extCLK is made shorter, sufficient set up time (tsu+tsu') can be ensured internally, the cycle period can be shortened accordingly, thereby allowing high speed operation. The set up time and hold time are necessary to keep an external signal at a prescribed state regardless of the internal access operation in order to surely generate an internal signal. Therefore, the shorter these times, the shorter the clock cycle period. Similarly, since internal clock signal intCLK0 is delayed by inverter 1c, set up time with respect to the external clock enable signal extCKE can also be made longer effectively.

Internal clock generating circuit 4 includes an NAND circuit 4a receiving internal clock enable signal intCKE and an output signal from inverter 1c, and an inverter 4b receiving an output signal from NAND circuit 4a. Complementary internal clock signal intZCLK is output from NAND circuit 4a, and internal clock signal intCLK is output from inverter 4b.

NAND circuit 4a may be replaced by an AND circuit receiving an output signal from inverter 1c and internal clock enable signal intCKE. In that case, a clock signal having opposite phase to external clock signal extCLK is to be output from inverter 1c. Because of NAND circuits 1d and 4a, internal clock signals intZCLK0 and intZCLK come to have the same delay time, and hence it becomes possible to raise internal clock signal intCLK at an earlier timing to latch the external signal and to make the internal signal intCOM definite, so that the timing of starting internal operation can be set earlier.

Figure 7A:
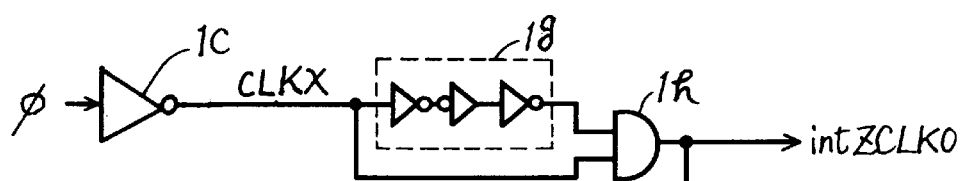
FIG. 7A shows a structure of a modification of the clock buffer circuit shown in FIG. 4
Figure 7B:
FIG. 7B shows waveforms of operation thereof.

FIGS. 7A and 7B show structure of a modification of clock buffer circuit 1 shown in FIG. 6 and its operation, respectively. Referring to FIG. 7A, clock buffer circuit 1 includes a delay circuit 1g for inverting and delaying an output signal CLKX from inverter 1c, an AND circuit 1h receiving an output signal from inverter 1c and an output signal from delay circuit 1g, and an inverter 1f receiving an output signal from AND circuit 1h. Complementary internal clock signal intZCLK0 is output from AND circuit 1h, and internal clock signal intCLK0 is output from inverter 1f.

In the structure shown in FIG. 7A, from AND circuit 1h, internal clock signal intCLK0 is output in response to the fall of the input signal φ of inverter 1c as shown in FIG. 7B, which clock signal intCLK0 is kept at the H level for the delay time of delay circuit 1g. Only the rise of internal clock signals intCLK0 and intCLK are synchronized with external clock signal extCLK, and the fall of these signals is not synchronized with the fall of external clock signal extCLK. However, in the SDRAM, latch circuit performs latching operation in synchronization with the rise of internal clock signals intCLK0 and intCLK in the input stage, and hence the external signal can be surely taken in to generate an internal signal. The delay time of the delay circuit 1g is shorter than 1 clock cycle period. However, the delay time may be shorter than half the cycle of the external clock signal extCLK, or it may be longer than half the cycle, as shown in FIG. 7B (the case where it is longer is denoted by the dotted line). What is necessary is that minimum H level period of the internal clock signal intCLK is ensured.

Figure 8:
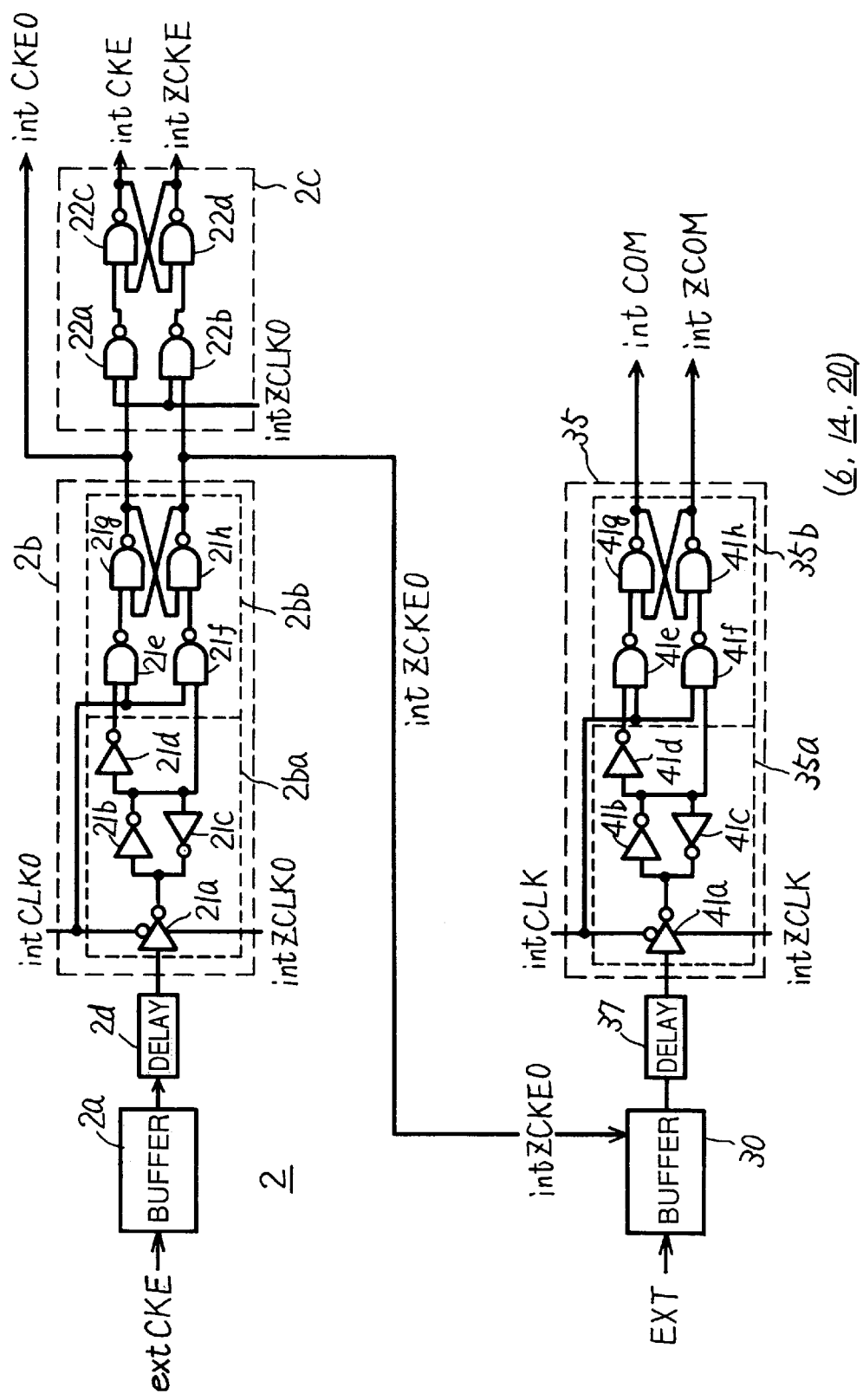
FIG. 8 shows an example of the structures of CKE buffer and external signal input buffer shown in FIG. 4.

FIG. 8 shows a specific structure of the portion generating internal clock enable signal intCKE and internal signal intCOM. Referring to FIG. 8, CKE buffer 2 includes a buffer 2a receiving external clock enable signal extCKE, a delay circuit 2d delaying an output signal from buffer 2a, a latch circuit 2b taking in the output signal from delay circuit 2d, latching and shifting the same to generate output/input buffer enable signals intCKE0 and intZCKE0 in synchronization with the first internal clock signal intCLK0, and a latch circuit 2c for taking in the output signal from latch circuit 2b and latching and outputting the same in synchronization with the first internal clock signal intZCLK0.

Figure 17A:
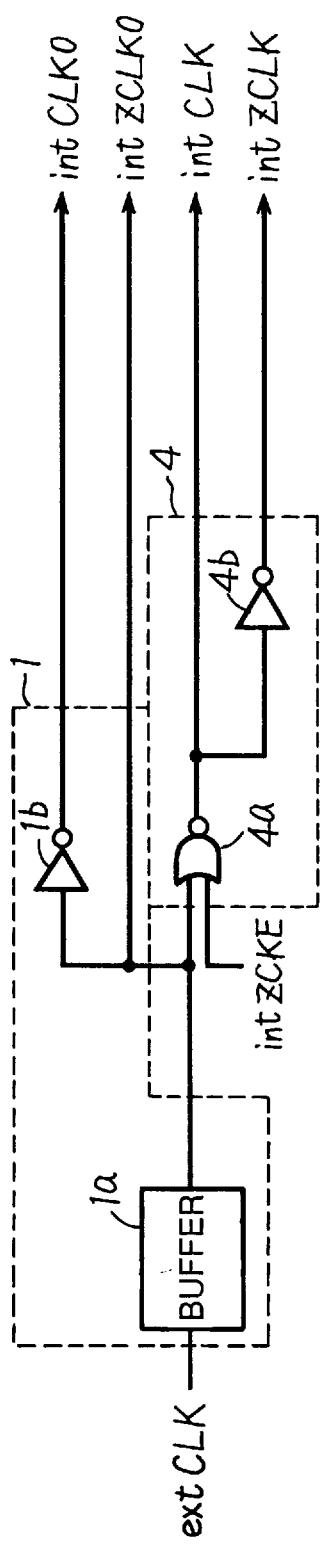
FIG. 17A shows a structure of a conventional clock buffer circuit.
Figure 17B:
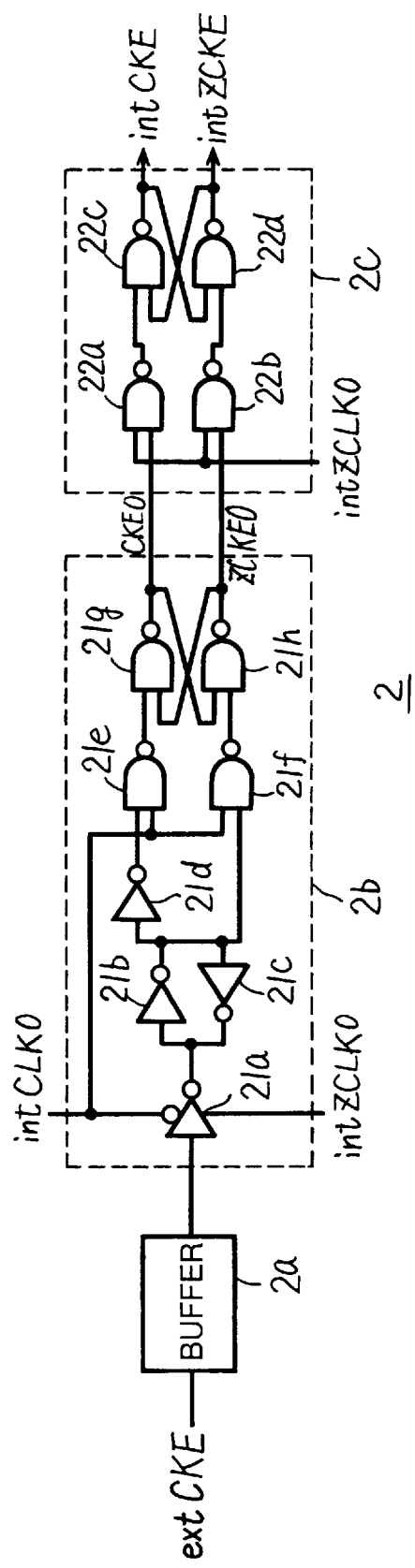
FIG. 17B shows an example of a structure of a conventional CKE buffer circuit.

Latch circuit 2b includes, similarly to the structure shown in FIG. 17B, a latch 2ba which is set to the through state when internal clock signal intCLK0 is at the L level and set to the latch state when internal clock signal intCLK0 is at the H level, and a latch 2bb which is set to the latch state when internal clock signal intCLK0 is at the L level and set to the through state when the first internal clock signal intCLK0 is at the H level. The structures of the first and second latches 2ba and 2bb are the same as those shown in FIG. 17B, and corresponding portions are denoted by the same reference characters. The internal structure of the second latch circuit 2c is also the same as that shown in FIG. 17B, and corresponding portions are denoted by the same reference characters.

The input buffer circuit generating internal signal intCOM from external signal EXT includes an input buffer 30 which is selectively activated in synchronization with input buffer enable signal intZCKE0, a delay circuit 37 delaying an output signal from input buffer 30, and a latch circuit 35 which takes in the output signal from delay circuit 37 latches and shifts the same in synchronization with internal clock signal intCLK, to generate internal signals intCOM and intZCOM. Latch circuit 35 includes a latch 35a which is set to the through state when internal clock signal intCLK is at the L level and set to the latch state when internal clock signal intCLK is at the H level, and a latch 35b which is set to the through state when internal clock signal intCLK is at the H level and set to the latch state when internal clock signal intCLK is at the L level.

Similarly to the buffer shown in FIG. 1, input buffer 30 has a structure of a current mirror type differential amplifying circuit, which is set to the operative state when input buffer enable signal intZCKE0 is at the L level, and set to the inoperative state with its current path shut off when the input buffer enable signal intZCKE0 is at the H level.

Latch 35a includes a tristate inverter 41a which is selectively set to the operative state in synchronization with internal clock signals intCLK and intZCLK for inverting an output signal from delay circuit 37, an inverter 41b receiving an output signal from tristate inverter 41a, an inverter 41c for inverting an output signal from inverter 41b and for transmission to the input portion of inverter 41b, and an inverter 41d for inverting an output signal from inverter 41b. Inverters 41b and 41c constitute a latch circuit. Tristate inverter 41a is set to the operative state when internal clock signal intCLK is at the L level and the complementary internal clock signal intZCLK is at the H level and operates as an inverter, and it is set to the output high impedance state when the internal clock signal intCLK is at the H level and the complementary internal clock signal intZCLK is at the L level.

Latch 35b includes an NAND circuit 41e receiving internal clock signal intCLK and an output signal from inverter 41d, an NAND circuit 41f receiving internal clock signal intCLK and an output signal from inverter 41b, an NAND circuit 41g receiving at one input an output signal from NAND circuit 41e for outputting internal signal intCOM, and an NAND circuit 41h receiving an output signal from NAND circuit 41f and internal signal intCOM for outputting a complementary internal signal intZCOM. The signal intZCOM output from NAND circuit 41h is also applied to another input of NAND circuit 41g.

Internal structures of latch circuits 2b and 35 are substantially the same, except that the clock signal defining the timing of latching and shifting is different.

The first internal signal intCLK0 is conventionally output through inverter 1b as shown in FIG. 17A, while internal clock signal intCLK is output through NOR circuit 4a'. The complementary first internal clock signal intZCLK0 is output from delay circuit 1c, and complementary internal clock signal intCLK is output from NOR circuit 4a' through inverter 4b. Therefore, the difference in timing of change of internal signals intCLK0 and intCLK is approximately the difference in delay time of inverter 1b and NOR circuit 4a', which is a negligible value.

Similarly, if the structure is adapted such that the complementary first internal clock signal intZCLK0 is output from the delay circuit through two stages of inverters, complementary internal clock signals intZCLK and intZCLK0 are generated approximately at the same timing. Therefore, when the input buffer enable signal intZCKE0 attains to the H level in accordance with the external clock enable signal extCKE, it can be considered that internal signal intCOM has already changed to the state corresponding to the state of the external signal EXT and held by latch 35b. Therefore, even when the input buffer enable signal intZCKE0 is rendered inactive (H level) at an earlier timing, it can be considered that external signal EXT has been already latched by latch circuit 35 as internal signal intCOM by that time. Thus, the arrangement of FIG. 17A can be combinedly used with the arrangement of FIG. 8, to obtain the desired effect. The function of delay circuits 2d and 37 will be described.

Figure 9:
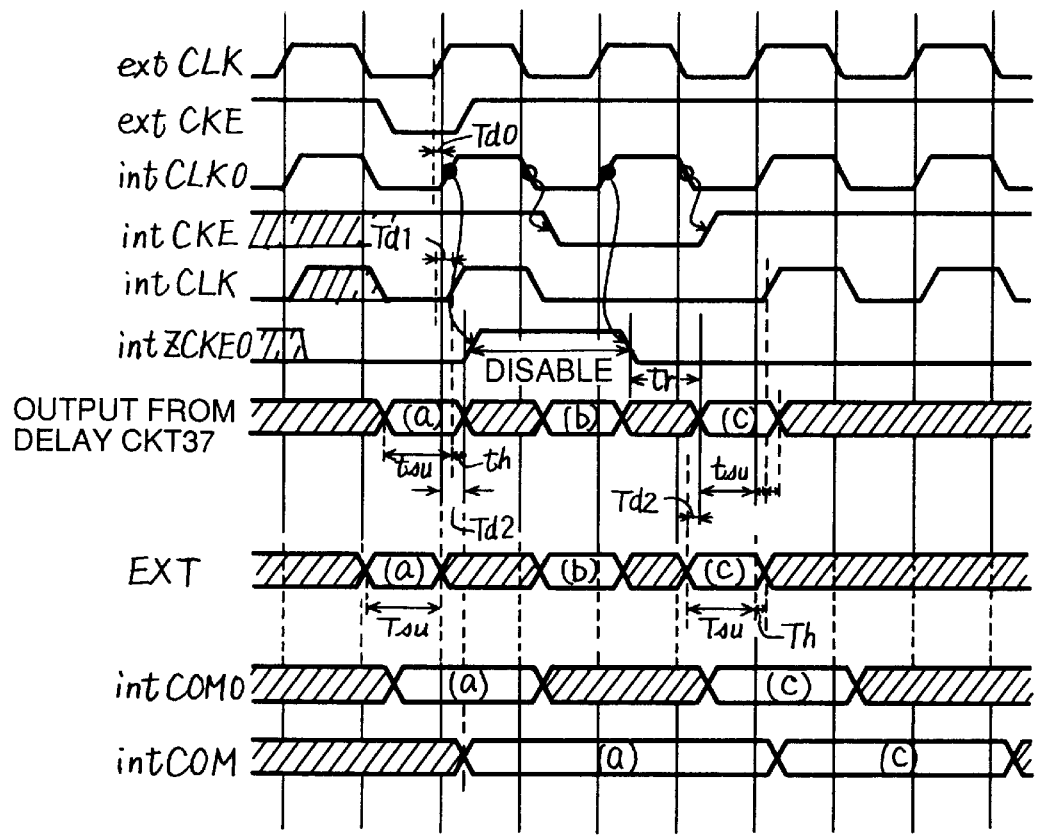
FIG. 9 is a timing chart representing an operation of the structure shown in FIG. 8.

FIG. 9 is a timing chart for helping the understanding of the functions of delay circuits 1c, 2d and 37 provided in succeeding stages of buffer circuits 1a, 2a and 30, respectively, shown in FIGS. 6 to 8. Referring to FIG. 9, external clock signal extCLK is changed into the first internal clock signal intCLK0, delayed by the delay time Td0 by delay circuit 1c. Taking into consideration the delay at NOR gate 4a' or NAND gate 4a, internal clock signal intCLK changes with delay by the time Td1 from external clock signal extCLK.

Assume that external signal EXT ((a)) has a set up time of Tsu with respect to external clock signal extCLK and that the hold time Th with respect to external clock signal extCLK is 0. In this case, the external signal EXT is delayed by time Td2 by delay circuit 37. Therefore, the output signal (a) from delay circuit 37 has such set up time tsu and hold time th as represented by the following equations with respect to the internal clock signal intCLK.

tsu=Tsu+Td1−Td2, th=Th(=0)+Td2−Td1.

Therefore, if the condition Td2>Td1 is satisfied, even when the hold time of external signal EXT with respect to the external clock signal extCLK is 0, the hold time th with respect to the internal clock signal intCLK has a positive value (Td2−Td1), and hence even when the internal clock signal intCLK0 rises at an earlier timing (when Td0 is very small), it is possible to surely take the external signal EXT in and to make definite the output signal intCOM0 of the first latch 35a.

As for the external signal EXT ((c)), the set up time tsu of the signal output from delay circuit 37 with respect to internal clock signal intCLK becomes shorter than the set up time Tsu of external signal EXT ((c)) with respect to the external clock signal extCLK. Therefore, in order to ensure minimum set up time tsu, it is necessary to set the set up timing of external signal EXT ((c)) earlier. The delay time Td2 is provided to ensure hold time of the output signal from delay circuit 37, of which value is sufficiently smaller than the reset time tr (the hold time is shorter than the set up time). Therefore, in this case, the timing at which input buffer enable signal intZCKE0 falls to the L level is sufficiently earlier than the set up timing of external signal EXT ((c)), and hence external signal EXT can be surely set up even at a high speed operation.

When internal clock signal intCLK is invalid, input buffer enable signal intZCKE0 is set to the H level in synchronization with the rise of the first internal clock signal intCLK0. The input buffer enable signal intZCKE0 is generated through latch 2bb shown in FIG. 8. Therefore, at least a delay of two stages of gates (NAND circuits) is necessary from the rise of the internal clock signal intCLK0 to the H level. Meanwhile, internal clock signal intCLK is generated by one stage of gate (NOR circuit 4a) in accordance with internal clock signal intZCLK0. Therefore, the rise of input buffer enable signal intZCKE0 is delayed at least by one stage of gate from the rise of internal clock signal intCLK. At this time, it is possible that the time difference between the rises of internal clock signal intCLK and input buffer enable signal intZCKE0 is small and input buffer 30 is inactivated before the external signal EXT is taken by latch 35. However, while the internal clock signal intCLK is at the L level, tristate inverter 41a is at the operative state, and the output signal therefrom is latched by latches 41b and 41c, and as long as the output signal from delay circuit 37 is at a definite state at the transition of internal clock signal intCLK from L to H level, it is possible to surely take and latch the external signal EXT to generate the internal signal intCOM.

At this time, specially if internal clock signals intCLK0 and intCLK are generated approximately at the same timing as shown in FIG. 6, then it can be considered that when input buffer enable signal intZCKE0 changes from the L to the H level, the internal signal intCOM is also set to the state in accordance with the external signal EXT, as latch circuit 2b and 35 have substantially the same structures. Therefore, even when input buffer enable signal intZCKE0 rises at an earlier timing, it is possible to surely take external signal EXT and to generate internal signal intCOM. Thus, the combination of the arrangements of FIGS. 6 and 8 is more advantageous.

In the foregoing, an operation has been described in which external clock enable signal extCKE is kept at the L level only in one clock cycle period. However, by setting the external clock enable signal extCKE continuously at the L level in the standby state, input buffer enable signal intCKE0 is continuously kept at the H level, current path in input buffer 30 is kept shut off during the period standby, and hence current consumption can be reduced.

Figure 10A:
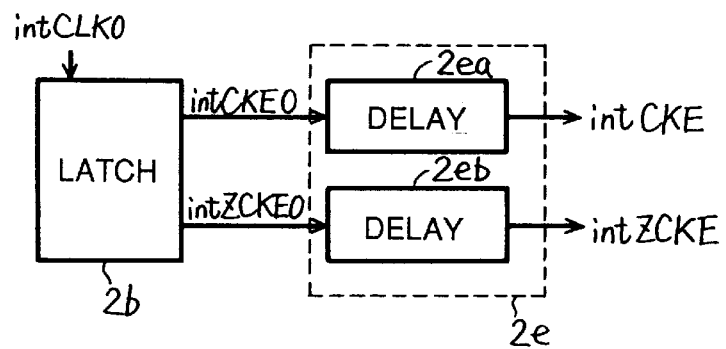
FIG. 10A shows a structure of a modification of the CKE buffer shown in FIG. 8

FIG. 10A shows a structure of a modification of the CKE buffer. In the structure of the CKE buffer shown in FIG. 10A, delay circuit 2e for providing a delay to input buffer enable signals intCKE0 and intZCKE0 from latch circuit 2d is provided instead of flipflop 2c outputting internal clock enable signals intCKE and intZCKE. Delay circuit 2e includes a delay circuit 2ea delaying input buffer enable signal intCKE0 for outputting an internal clock enable signal intCKE, and a delay circuit 2eb delaying input buffer enable signal intZCKE0 for outputting internal clock enable signal intZCKE.

Figure 10B:
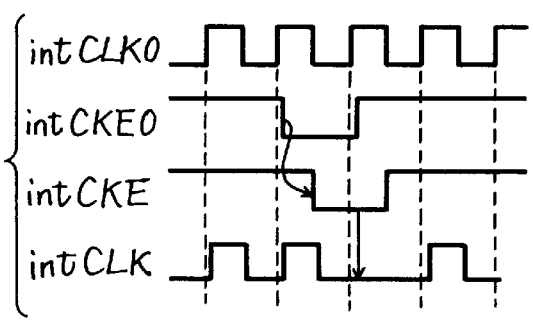
FIG. 10B shows waveforms of operation.

With such delay circuit 2a as shown in FIG. 10A, when input buffer enable signal intCKE0 falls in synchronization with the rise of internal clock signal intCLK0 as shown in FIG. 10B, internal clock enable signal intCKE0 falls to the L level after the lapse of a prescribed time period (delay time of delay circuit 2e). Flipflop 2c has a function of providing a delay of half clock cycle to external clock enable signal extCKE transmission it and maintaining the state for one clock cycle period. The function of maintaining the state in one clock cycle period is realized by the latch circuit 2b. Therefore, even when using delay circuit 2e alternatively, generation of internal clock signal intCLK in the cycle next to that cycle in which an active external clock enable signal extCKE is applied can surely be stopped.

When the delay circuit 2e is used, it may be likely that the internal clock enable signal intCKE is set to the L level while the internal clock signal intCLK is at the H level, dependent on the delay time thereof. In order to avoid such a state, the delay times of delay circuits 2ea and 2eb have to be set to at least half clock cycle and at most one clock cycle.

If the clock frequency is different, one period of the clock also differs, and hence the length of the period in which internal clock signal intCLK0 (intCLK) is at the H level differs. In such a case, a structure may be used in which a plurality of delay elements realizing a plurality of delay times are provided in delay circuits 2ea and 2eb and a delay element having appropriate delay time is selected in accordance with the frequency of the external clock signal extCLK used. As an example, a structure in which data for selecting delay time is stored in a command register which is normally provided in the SDRAM, and cascade-connected delay element are selectively short-circuited in accordance with the stored data, may be used.

[Modification of the Input Buffer Circuit]

Figure 11:
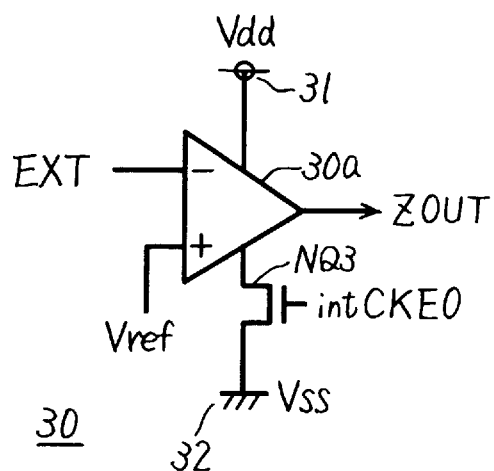
FIG. 11 shows a first modification of an input buffer circuit in accordance with an embodiment of the present invention.

FIG. 11 shows a structure of a modification of an input buffer circuit used in the first embodiment of the present invention. Referring to FIG. 11, input buffer 30 includes a differential amplifying circuit 30a for differentially amplifying external signal EXT and reference voltage Vref, and an n channel MOS transistor NQ3 connected between an internal ground node of differential amplifying circuit 35a (common source node of differential n channel MOS transistor) and ground node 32. MOS transistor NQ3 receives at its gate the input buffer enable signal intCKE0. Differential amplifying circuit 30a is fed with power supply voltage Vdd from power supply node 31. In the structure shown in FIG. 11, when input buffer enable signal intCKE0 attains to the L level, n channel MOS transistor NQ3 is rendered non-conductive, a current path from differential amplifying circuit 30a to ground node 32 is shut off, and differential amplifying circuit 30a is set to the inoperative state.

Differential amplifying circuit 30a receives at its negative input the external signal EXT and at its positive input, the reference voltage Vref. The internal structure is the same as a differential amplifying circuit constituted by transistors PQ1, PQ2, NQ1, NT and NQ2 included in input buffer circuit 30 shown in FIG. 1. Differential amplifying circuit 30a can have a different internal structure, provided that it has a function of differentially amplifying reference voltage Vref and external signal EXT.

In the structure shown in FIG. 11 also, when internal clock signal intCLK is not generated, the current path between power supply node 31 of differential amplifying circuit 30a and ground node 32 is shut off. Therefore, it is possible to operate input buffer circuit 30 only when necessary, and current consumption can be reduced.

[Second Modification of the Input Buffer Circuit]

Figure 12:
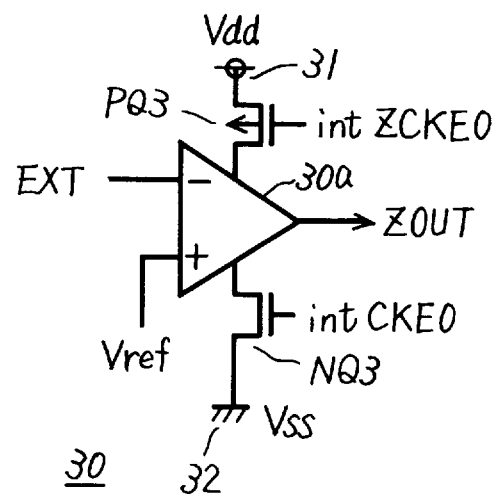
FIG. 12 shows a structure of a second modification of the input buffer circuit in accordance with a first embodiment of the present invention.

FIG. 12 shows a structure of a second modification of the input buffer circuit in accordance with the first embodiment of the present invention. Referring to FIG. 12, differential amplifying circuit 30a constituting input buffer 30 is fed with power supply voltage Vdd from power supply node 31 through p channel MOS transistor PQ3, and supplied with ground voltage Vss from ground node 32 through n channel MOS transistor NQ3. MOS transistor PQ3 receives at its gate the input buffer enable signal intZCKE0, the MOS transistor NQ3 receives at its gate the input buffer enable signal intCKE0.

In the structure shown in FIG. 12, MOS transistors PQ3 and NQ3 are both rendered non-conductive in accordance with input buffer enable signals intZCKE0 and intCKE0, so that differential amplifying circuit 30a is isolated from power supply node 31 and ground node 32. In this state, even when the output signal ZOUT fluctuates because of the influence of a leak current or noise, current is not at all consumed in differential amplifying circuit 30a (as it is isolated from output node and power supply nodes (including both the power supply node 31 and the ground node 32)), and hence current consumption can further be reduced. When the MOS transistor like MOS transistor NT is provided, the signal ZOUT is fixed to L level, and such noise problem can be avoided.

[Other Applications]

In the foregoing, an input buffer circuit of an SDRAM has been described. However, the same effect can be obtained even in a memory such as a synchronous SRAM (Static Random Access Memory) provided that external signal is taken in synchronization with the clock signal.

[Effects of the Invention]

As described above, according to the present invention, in a clock synchronous type semiconductor memory device, current path of an input buffer is shut off by generating an input buffer enable signal in synchronization with a leading edge (rise) of an internal clock signal. Therefore, even when the state in which internal clock signal is not generated is returnstate the state in which the internal clock signal is generated, the set up time of the applied external signal can be surely provided, and hence a clock synchronous semiconductor memory device which operates at high speed and consumes less current can be realized.

Further, the input buffer circuit is set to the inoperative state after the external signal is taken in and the state of the internal signal is defined. Therefore, even when the hold time of the external signal is short, an internal signal corresponding to the external signal can be surely generated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device operating in synchronization with an externally applied external clock signal, comprising:

clock buffer means for generating a first internal clock signal in accordance with said external clock signal;

latch means for taking in an externally applied external clock enable signal designating validity of said external clock signal in synchronization with said first internal clock signal, and for generating and outputting an input buffer enable signal which is activated when said external clock enable signal is active;

clock enable means for delaying said input buffer enable signal for generating an internal clock enable signal;

internal clock generating means activated in response to said internal clock enable signal being active, for generating a second internal clock signal in accordance with said external clock signal;

input buffer means activated in response to said input buffer enable signal being active for buffering an externally applied signal different from said external clock enable signal and said external clock signal, said input buffer means using voltages on first and second power supply nodes as operational power supply voltages and including means for shutting off a current flowing path between said first and second power supply nodes when said input buffer enable signal is inactive; and internal signal generating means for latching an output signal from said input buffer means in synchronization with said second internal clock signal for generating an internal signal.

2. The synchronous semiconductor memory device according to claim 1, wherein said external clock signal repetitively changes between first and second potential levels;

said latch means includes means for latching said external clock enable signal in synchronization with the change in potential level of said first internal clock signal from said first potential level to said second potential level for outputting; and said internal signal generating means has substantially a same common structure as said latch means, and latches an output signal from said input buffer means in response to the change of said second internal clock signal from said first potential level to said second potential level for generating said internal signal.

3. The synchronous semiconductor memory device according to claim 1, wherein said latch means includes a buffer circuit for buffering said external clock enable signal, a first latch coupled to receive an output signal from said buffer circuit, set to a through state permitting passage of an output signal from said buffer circuit in response to said first internal clock signal being at said second potential level and set to a latch state for maintaining a state of the output signal regardless of a signal applied from said buffer circuit in response to said first internal clock signal being at said first potential level, a second latch coupled to said first latch, set to said latch state in response to said first internal clock signal being at said first potential level and set to said through state in response to said first internal clock signal being at said second potential level.

4. The synchronous semiconductor memory device according to claim 1, wherein said clock enable means includes a latch circuit which is set to the latch state complementarily to said latch means in synchronization with said first internal clock signal.

5. The synchronous semiconductor memory device according to claim 1, wherein said clock buffer means includes a buffer circuit for buffering said external clock signal, and means for generating a signal changing in synchronization with change of an output signal from said buffer circuit as said first internal clock signal.

6. The semiconductor memory device according to claim 5, further comprising a delay circuit for delaying an output signal from said buffer circuit for application to the first internal clock signal generating means.

7. The synchronous semiconductor memory device according to claim 3, wherein said latch means includes a delay circuit provided between said buffer circuit and said first latch.

8. The synchronous semiconductor memory device according to claim 1, further comprising a delay circuit provided between said input buffer means and said internal signal generating means.

9. The synchronous semiconductor memory device according to claim 1, wherein said clock buffer means includes a buffer circuit for buffering said external clock signal, and a pulse generator coupled to receive an output signal of said buffer circuit, for generating a one-shot pulse signal as said first internal clock signal in response to the output signal of said buffer circuit.

10. The synchronous semiconductor memory device according to claim 1, wherein said clock buffer includes a buffer for buffering said external clock signal, and a gate for gating an output of said buffer to generate said first internal clock signal, and said internal clock generating means includes another gate enabled in response to said internal clock enable signal for gating said output signal of said buffer to generate said internal clock signal, said gate and said another gate providing substantially a same common gate delay.

11. The synchronous semiconductor memory device according to claim 1, wherein said input buffer means includes a current-mirror type differential amplifier for differentially amplifying the externally applied signal and a reference potential for application to said internal signal generating means.

12. The synchronous semiconductor memory device according to claim 11, wherein said current-mirror type differential amplifier further includes an element responsive to deactivation of said internal clock enable signal for coupling an output of said current-mirror type differential amplifier to said second power supply node.

13. A synchronous semiconductor memory device operating in synchronization with an externally applied external clock signal, comprising:

clock buffer means for generating a first internal clock signal in accordance with said external clock signal;

latch means for taking in an externally applied external clock enable signal designating validity of said external clock signal in synchronization with said first internal clock signal, and for generating and outputting an input buffer enable signal which is activated when said external clock enable signal is active;

clock enable means for delaying said input buffer enable signal for generating an internal clock enable signal;

internal clock generating means activated in response to said internal clock enable signal being active, for generating a second internal clock signal in accordance with said external clock signal;

internal signal generating means for latching a received signal in synchronization with said second internal clock signal for generating an internal signal.

14. A synchronous semiconductor memory device operating in synchronization with an externally applied external clock signal, comprising:

clock buffer circuitry for generating a first internal clock signal in accordance with said external clock signal;

a buffer circuit for buffering an externally applied external clock enable signal designating validity of said first internal clock signal;

a first latch coupled to receive an output signal from said buffer circuit, set to a through state permitting passage of the output signal from said buffer circuit in response to said first internal clock signal being at a first potential level and set to a latch state for maintaining an output signal thereof regardless of the state of the output signal from said buffer circuit in response to said first internal clock signal being at a second potential level;

a second latch coupled to said first latch, set to said latch state in response to said first internal clock signal being at said first potential level and set to said through state in response to said first internal clock signal being at said second potential level, for generating and outputting an input buffer enable signal which is activated when said external clock enable signal is active;

a latch circuit coupled to said second latch and set to the latch state complementarily to said second latch in synchronization with said first internal clock signal, for delaying said input buffer enable signal to generate an internal clock enable signal;

internal clock generating circuitry activated in response to said internal clock enable signal being active, for generating a second internal clock signal in accordance with said external clock signal; and an input buffer means for buffering an externally applied signal different from said external clock enable signal and said external clock signal to generate a pre-internal signal when activated in response to said input buffer enable signal being active, said input buffer means including means for shutting off a current flowing through the input buffer means to inactivate the buffering operation in response to said input buffer enable signal being inactive.

15. The synchronous semiconductor memory device according to claim 14, further comprising internal signal generating circuitry for latching said pre-internal signal from the input buffer means in synchronization with said second internal clock signal for generating an internal signal.

16. The synchronous semiconductor memory device according to claim 14, wherein said input buffer means includes a current mirror type differential amplifying stage for differentially amplifying said externally applied signal and a reference potential, and a current source coupled to the differential amplifying state and cutting off a current flowing through the differential amplifying stage when inactivated in response to said input buffer enable signal being inactive.

* * * * *